United States Patent
Sugaya et al.

(10) Patent No.: US 10,483,212 B2
(45) Date of Patent: Nov. 19, 2019

(54) APPARATUS FOR STACKING SUBSTRATES AND METHOD FOR THE SAME

(71) Applicant: NIKON CORPORATION, Tokyo (JP)

(72) Inventors: Isao Sugaya, Kawasaki (JP); Kazuya Okamoto, Yokohama (JP); Hajime Mitsuishi, Yokohama (JP); Minoru Fukuda, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 15/618,615

(22) Filed: Jun. 9, 2017

(65) Prior Publication Data

US 2017/0278803 A1 Sep. 28, 2017

Related U.S. Application Data

(63) Continuation of application No. PCT/JP2015/084570, filed on Dec. 9, 2015.

(30) Foreign Application Priority Data

Dec. 10, 2014 (JP) ................................ 2014-250427

(51) Int. Cl.
*H01L 21/00* (2006.01)
*H01L 23/544* (2006.01)
(Continued)

(52) U.S. Cl.
CPC .......... *H01L 23/544* (2013.01); *B23K 20/002* (2013.01); *B23K 20/023* (2013.01);
(Continued)

(58) Field of Classification Search
None
See application file for complete search history.

(56) References Cited

U.S. PATENT DOCUMENTS 5,893,760 A 4/1999 Mikata et al.
7,678,713 B2 * 3/2010 Tsui .................. H01L 21/76825
438/778

(Continued)

FOREIGN PATENT DOCUMENTS

JP H09-260470 10/1997
JP 2006-259715 9/2006
(Continued)

OTHER PUBLICATIONS

International Preliminary Report on Patentability issued by The International Bureau of WIPO, in counterpart International Application No. PCT/JP2015/084570, dated Jun. 13, 2017 (6 pages).

(Continued)

*Primary Examiner* — Calvin Y Choi
(74) *Attorney, Agent, or Firm* — Finnegan, Henderson, Farabow, Garrett & Dunner, L.L.P.

(57) ABSTRACT

A substrate stacking apparatus that stacks first and second substrates on each other, by forming a contact region where the first substrate held by a first holding section and the second substrate held by a second holding section contact each other, at one portion of the first and second substrates, and expanding the contact region from the one portion by releasing holding of the first substrate by the first holding section, wherein an amount of deformation occurring in a plurality of directions at least in the first substrate differs when the contact region expands, and the substrate stacking apparatus includes a restricting section that restricts misalignment between the first and second substrates caused by a difference in the amount of deformation. In the substrate stacking apparatus above, the restricting section may restrict the misalignment such that an amount of the misalignment is less than or equal to a prescribed value.

24 Claims, 28 Drawing Sheets

(51) Int. Cl.
| | |
|---|---|
| B65H 31/34 | (2006.01) |
| H01L 21/68 | (2006.01) |
| H01L 23/00 | (2006.01) |
| B23K 37/04 | (2006.01) |
| B23K 20/00 | (2006.01) |
| B23K 20/02 | (2006.01) |
| B23K 20/24 | (2006.01) |
| H01L 21/67 | (2006.01) |
| H01L 21/683 | (2006.01) |
| H01L 21/687 | (2006.01) |
| B23K 101/40 | (2006.01) |

(52) U.S. Cl.
CPC .......... *B23K 20/24* (2013.01); *B23K 37/0408* (2013.01); *B65H 31/34* (2013.01); *H01L 21/67092* (2013.01); *H01L 21/67288* (2013.01); *H01L 21/68* (2013.01); *H01L 21/681* (2013.01); *H01L 21/6831* (2013.01); *H01L 21/68735* (2013.01); *H01L 21/68742* (2013.01); *H01L 24/75* (2013.01); *H01L 24/94* (2013.01); *B23K 2101/40* (2018.08); *H01L 2223/5446* (2013.01); *H01L 2223/54426* (2013.01); *H01L 2223/54493* (2013.01); *H01L 2224/16227* (2013.01); *H01L 2224/16245* (2013.01); *H01L 2224/75724* (2013.01); *H01L 2224/94* (2013.01); *H01L 2924/10253* (2013.01); *H01L 2924/3511* (2013.01)

(56) References Cited

U.S. PATENT DOCUMENTS

| | | | |
|---|---|---|---|
| 9,443,711 B2 | 9/2016 | Kinouchi et al. | |
| 2001/0003049 A1* | 6/2001 | Fukasawa | B29C 43/18 |
| | | | 438/127 |
| 2008/0088033 A1* | 4/2008 | Humpston | H01L 23/49811 |
| | | | 257/778 |
| 2009/0034860 A1 | 2/2009 | Hirashima | |
| 2012/0006463 A1 | 1/2012 | Gaudin | |
| 2012/0329241 A1 | 12/2012 | Yamaguchi et al. | |
| 2014/0224405 A1 | 8/2014 | Kinouchi et al. | |
| 2014/0363951 A1* | 12/2014 | Rossini | H01L 21/76251 |
| | | | 438/458 |
| 2015/0210057 A1* | 7/2015 | Wagenleithner | B32B 37/0076 |
| | | | 156/290 |

FOREIGN PATENT DOCUMENTS

| | | |
|---|---|---|
| JP | 2012-019209 | 1/2012 |
| JP | 2013-008921 | 1/2013 |
| JP | 2013-098186 A | 5/2013 |
| WO | WO 2013/098529 A1 | 7/2013 |
| WO | WO 2014/191033 A1 | 12/2014 |

OTHER PUBLICATIONS

International Search Report issued by the Japan Patent Office in International Application No. PCT/JP2015/084570, dated Mar. 8, 2016 (4 pages).

Office Action issued by the Taiwan Intellectual Property Office dated Mar. 12, 2019 in counterpart Taiwanese Patent Application No. 104141471, and English Translation thereof.

Office Action issued by the Japanese Patent Office dated Mar. 12, 2019 in counterpart Japanese Patent Application No. 2016-563719, and English Translation thereof.

Office Action issued by the Japanese Patent Office dated Jun. 25, 2019 in counterpart Japanese Patent Application No. 2016-563719, and English Translation thereof.

* cited by examiner

APPARATUS FOR STACKING SUBSTRATES AND METHOD FOR THE SAME

The contents of the following Japanese patent applications are incorporated herein by reference:
No. 2014-250427 filed on Dec. 10, 2014 and
No. PCT/JP2015/084570 filed on Dec. 9, 2015.

BACKGROUND

1. Technical Field

The present invention relates to a substrate stacking apparatus and a substrate stacking method.

2. Related Art

There is a technique for manufacturing a layered semiconductor device by layering substrates, as shown in Patent Document 1, for example.
Patent Document 1: Japanese Patent Application Publication No. 2013-098186

Even if substrates are aligned prior to being stacked, there are cases where circuits on the substrates become misaligned with each other when observed after the stacking of the substrates.

SUMMARY

According to a first aspect of the present invention, provided is a substrate stacking apparatus that stacks a first substrate and a second substrate on each other, by forming a contact region where the first substrate held by a first holding section and the second substrate held by a second holding section contact each other, at one portion of the first substrate and the second substrate, and then expanding the contact region from the one portion by releasing holding of the first substrate by the first holding section, wherein an amount of deformation occurring in a plurality of directions at least in the first substrate differs when the contact region expands, and the substrate stacking apparatus comprises a restricting section that restricts misalignment between the first substrate and the second substrate caused by a difference in the amount of deformation.

According to a second aspect of the present invention, provided is a substrate processing method for stacking a first substrate and a second substrate on each other, by forming a contact region, where the first substrate held by a first holding section and the second substrate held by a second holding section contact each other, at one portion of the first substrate and the second substrate, and then expanding the contact region from the one portion by releasing holding of the first substrate by the first holding section, wherein an amount of deformation occurring in a plurality of directions at least in the first substrate differs when the contact region expands, and the substrate processing method comprises restriction of restricting misalignment between the first substrate and the second substrate caused by a difference in the amount of deformation.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
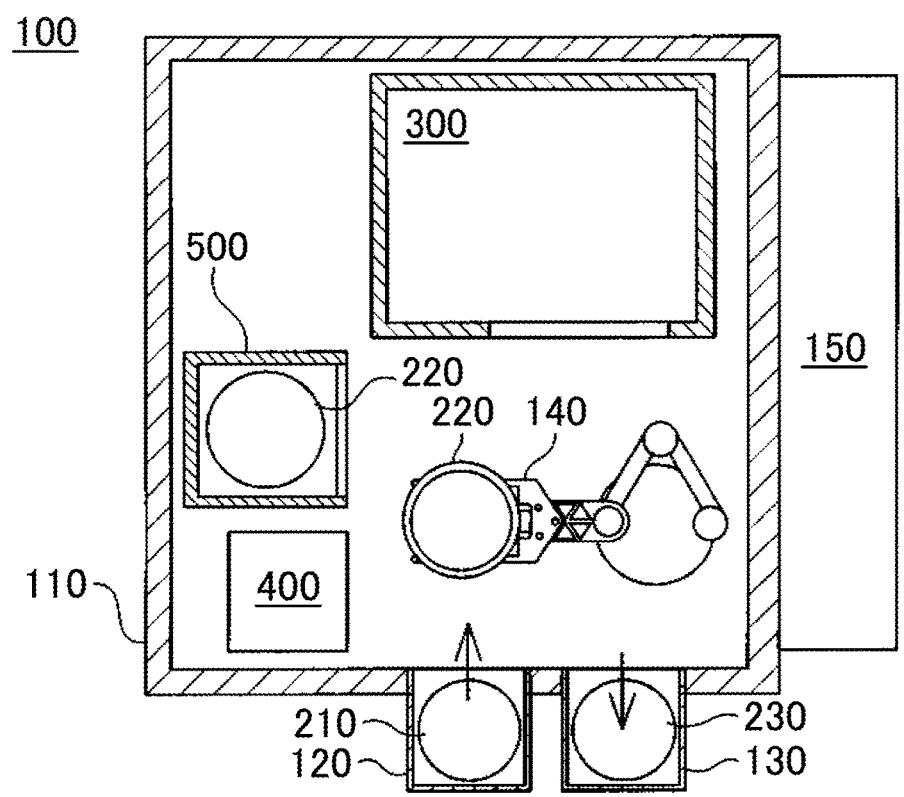
FIG. 1 is a schematic planar view of a substrate stacking apparatus 100.

FIG. 1 is a schematic planar view of a substrate stacking apparatus 100. The substrate stacking apparatus 100 includes a case 110, substrate cassettes 120 and 130 and a control section 150 arranged outside the case 110, and a transfer robot 140, an aligner 300, a holder stocker 400, and a pre-aligner 500 arranged inside the case 110. The inside of the case 110 is temperature-controlled, and is held at room temperature, for example.

The substrate cassette 120 contains substrates 210 that will be stacked in the future. The substrate cassette 130 contains layered structure substrates 230 manufactured by stacking the substrates 210. The substrate cassettes 120 and 130 can be individually attached to and detached from the case 110.

By using the substrate cassette 120, it is possible to carry a plurality of substrates 210 into the substrate stacking apparatus 100 at once. Furthermore, by using the substrate cassette 130, it is possible to carry a plurality of layered structure substrates 230 out of the substrate stacking apparatus 100 at once.

The transfer robot 140 realizes a transferring function inside the case 110. The transfer robot 140 transfers single substrates 210, substrate holders 220, substrate holders 220 holding substrates 210, layered structure substrates 230 formed by layering substrates 210, and the like.

The control section 150 performs overall control of each component of the substrate stacking apparatus 100, in conjunction with each other. Furthermore, the control section 150 receives user instructions from the outside and sets manufacturing conditions used when manufacturing the layered structure substrates 230. Yet further, the control section 150 also forms a user interface that displays the operational state of the substrate stacking apparatus 100 to the outside.

The aligner 300 includes a pair of stages that each hold a substrate 210 and face each other, and forms the layered structure substrate 230 by aligning the substrates 210 held on the stages with each other and then bringing these substrates 210 into contact with each other and stacking the substrates 210. Furthermore, there are cases where the aligner 300 performs a correction of the substrates 210, as described further below.

Inside the substrate stacking apparatus 100, the substrates 210 are handled in a state where the substrates 210 are held by the substrate holders 220. The substrate holders 220 hold the substrates 210 through attraction, such as by an electrostatic chuck. By handling the fragile substrate 210 integrally with the high-strength substrate holder 220, damage to the substrate 210 can be prevented and the operation of the substrate stacking apparatus 100 can be made faster.

The substrate holder 220 is made of a hard material such as alumina ceramics, and includes a holding portion that has substantially the same width as the surface area of the substrate 210 and an edge portion arranged outside the holding portion. Furthermore, the substrate holders 220 are prepared inside the substrate stacking apparatus 100, and each hold one substrate carried into the substrate stacking apparatus 100 at a time.

When a substrate 210 or layered structure substrate 230 is carried out of the substrate stacking apparatus 100, the substrate holder 220 is separated from the substrate 210 or the layered structure substrate 230. Accordingly, the substrate holder 220 remains inside the substrate stacking apparatus 100, and is used repeatedly. Therefore, the substrate holder 220 can be thought of as a portion of the substrate stacking apparatus 100. A substrate holder 220 that is not being used is contained and preserved in the holder stocker 400.

The pre-aligner 500 works together with the transfer robot 140 to cause the substrate holder 220 to hold the substrates 210 carried therein. Furthermore, the pre-aligner 500 is also used when a layered structure substrate 230 carried out of the aligner 300 is separated from the substrate holder 220.

In the substrate stacking apparatus 100 such as described above, in addition to substrates 210 having elements, circuits, terminals, and the like formed thereon, it is also possible to bond unprocessed silicon wafers, compound semiconductor wafers, glass substrates, and the like. The bonding may include bonding a circuit substrate to an unprocessed substrate or bonding unprocessed substrates to each other. The bonded substrates 210 may themselves each be a layered structure substrate 230 formed by previously layering a plurality of substrates.

Figure 2:
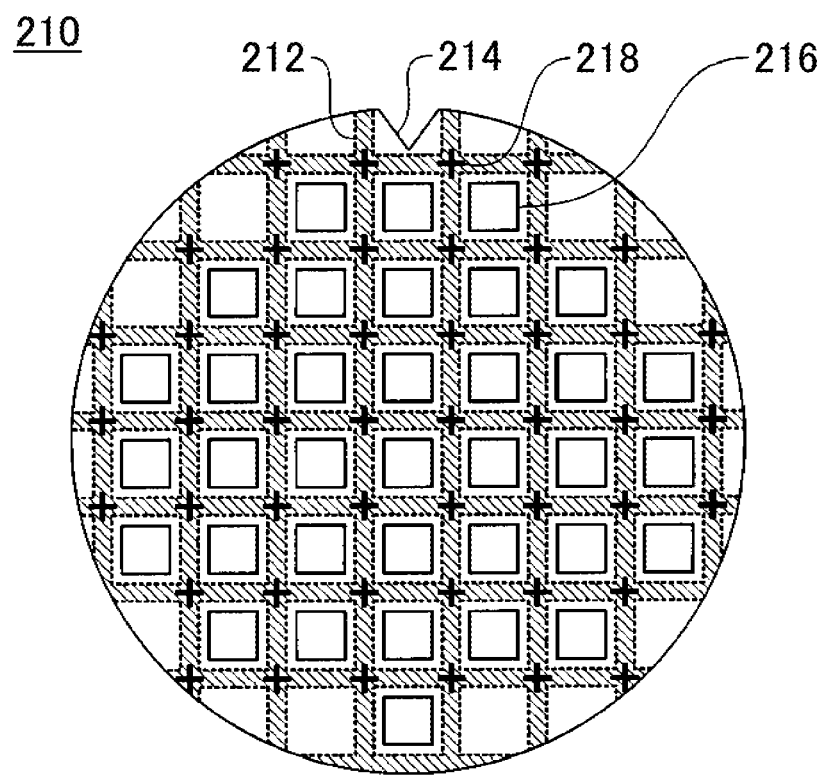
FIG. 2 is a schematic planar view of a substrate 210.

FIG. 2 is a schematic planar view of a substrate 210 stacked in the substrate stacking apparatus 100. The substrate 210 includes a notch 214, a plurality of circuit regions 216, and a plurality of alignment marks 218.

The notch 214 is formed in the circumferential edge of the substrate 210, which has an overall substantially circular shape, and serves as a marker indicating the crystal orientation in the substrate 210. When handling the substrate 210, it is possible to know the array direction or the like of the circuit regions 216 in the substrate 210 as well, by detecting the position of the notch 214. Furthermore, if the circuit regions 216 are formed including circuits that are different from each other on one substrate 210, it is possible to distinguish the circuit regions 216 from each other using the notch 214 as a reference.

The circuit regions 216 are arranged on the surface of the substrate 210 periodically in the surface direction of the substrate 210. Each circuit region 216 is provided with a semiconductor device, wiring, a protective film, and the like formed by photolithography techniques or the like. Pads, bumps, or the like serving as connection terminals when the substrate 210 is electrically connected to another substrate 210, a lead frame, or the like are arranged in the circuit regions 216.

The alignment marks 218 are one example of structures formed on the surface of the substrate 210, and are arranged overlapping with scribe lines 212 arranged between the circuit regions 216. The alignment marks 218 are used as markers when aligning this substrate 210 with another substrate 210 that is a layering target.

Figure 3:
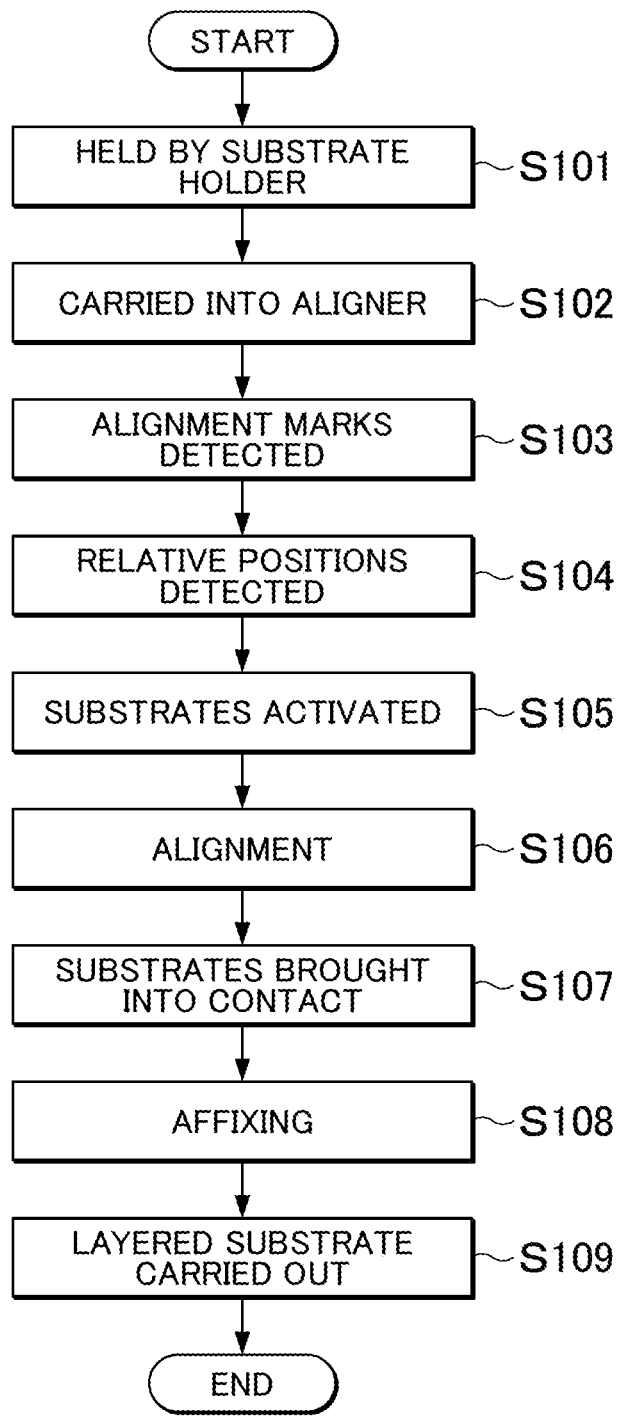
FIG. 3 is a flow chart showing the procedure for stacking the substrates 210.

FIG. 3 is a flow chart showing the procedure for manufacturing a layered structure substrate 230 by layering substrates 210 in the substrate stacking apparatus 100. In the substrate stacking apparatus 100, first, one substrate 211 at a time is held by a substrate holder 220 in the pre-aligner 500 (step S101).

The substrate holder 221 holding the substrate 211 is carried into the aligner 300 along with the substrate 211 (step S102). Next, another substrate 213 that is to be stacked on the substrate 211 is also carried into the aligner 300 while being held by a substrate holder 223.

FIGS. 4 to 8 are drawings for describing the structure and operation of the aligner 300. First, the structure of the aligner 300 will be described.

Figure 4:
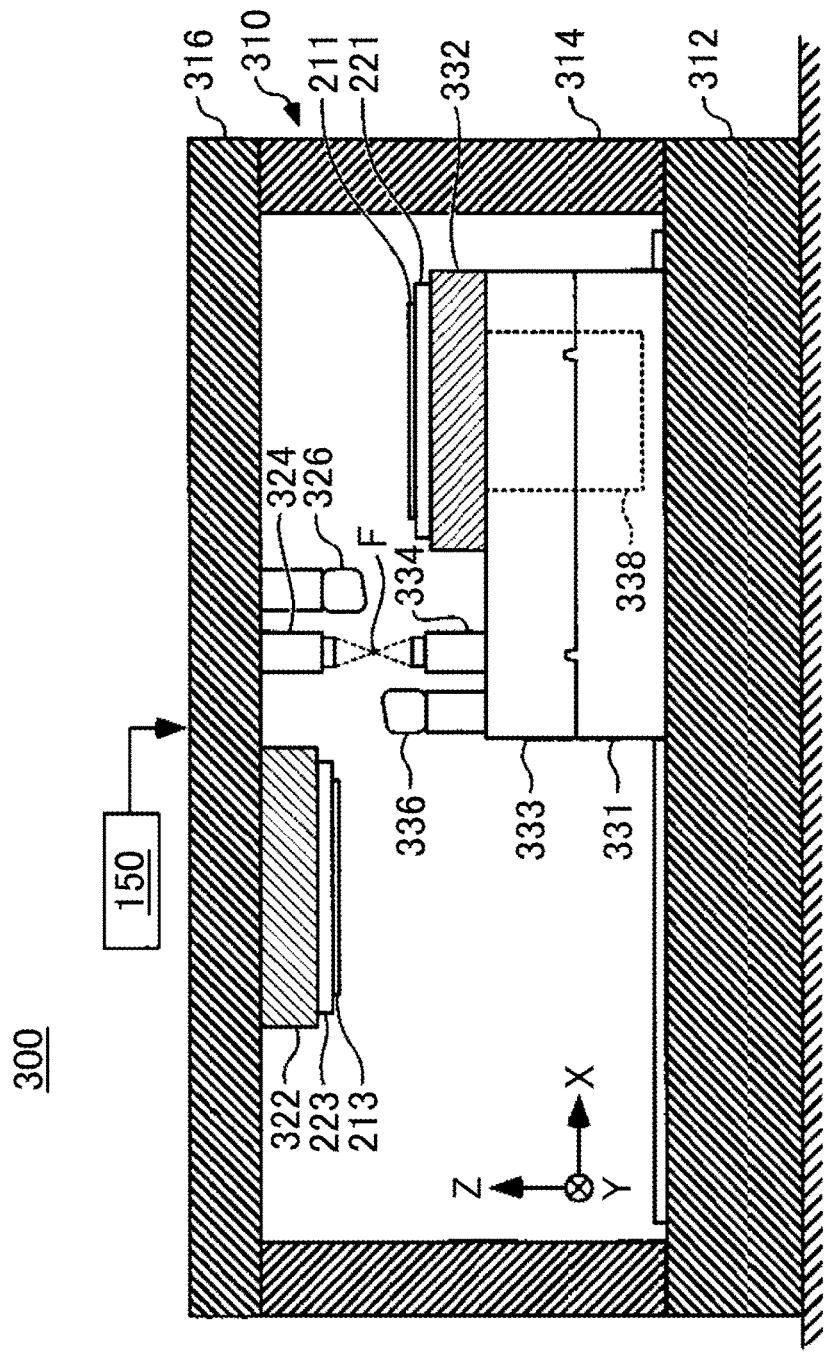
FIG. 4 is a schematic cross-sectional view of the aligner 300.

FIG. 4 is a cross-sectional view schematically showing the state of the aligner 300 immediately after the substrates 211 and 213 and the substrate holders 221 and 223 are carried. The aligner 300 in the substrate stacking apparatus 100 includes a frame 310, an upper stage 322, and a lower stage 332.

The frame 310 includes a bottom plate 312 and a top plate 316 that are parallel to a horizontal floor surface 301, and a plurality of support columns 314 that are perpendicular to a floor board. The bottom plate 312, the support columns 314, and the top plate 316 form the cuboid frame 310 that houses the other components of the aligner 300.

The upper stage 322 is secured to the bottom surface of the top plate 316 and faces downward, in the drawing. The upper stage 322 has a holding function realized by a vacuum chuck, an electrostatic chuck, or the like. In the state shown in the drawing, the substrate 213 is already held on the upper stage 322 along with the substrate holder 223.

A microscope 324 and an activation apparatus 326 are secured the bottom surface of the top plate 316 at the side of the upper stage 322. The microscope 324 can monitor the top surface of the substrate 210 held by the lower stage 332 arranged facing the upper stage 322. The activation apparatus 326 generates plasma for cleaning the top surface of the substrate 210 held by the lower stage 332. Oxygen plasma or nitrogen plasma, for example, is used as this plasma. The activation apparatuses 326 and 336 may be equipped separately from the aligner 300, and may transport the substrates and substrate holders into the aligner 300 using a robot.

The lower stage 332 is mounted on the top surface, in the drawing, of a Y-direction drive section 333 that overlaps with an X-direction drive section 331 arranged on the top surface of the bottom plate 312. In the state shown in the drawing, the substrate 211 is already held by the lower stage 332 along with the substrate holder 221. The substrate holder 221 continues holding the substrate 211, and the substrate 211 is kept in a corrected state.

The X-direction drive section 331 moves in the direction indicated by the X arrow in the drawing, parallel to the bottom plate 312. The Y-direction drive section 333 moves on the X-direction drive section 331 in the direction indicated by the Y arrow in the drawing, parallel to the bottom plate 312. By combining the operations of this X-direction drive section 331 and Y-direction drive section 333, the lower stage 332 moves two-dimensionally parallel to the bottom plate 312.

Furthermore, the lower stage 332 is supported by a raising and lowering drive section 338 that rises and falls in the direction indicated by the Z arrow, perpendicular to the bottom plate 312. In this way, it is possible for the lower stage 332 to be raised and lowered relative to the Y-direction drive section 333.

The movement amount of the lower stage 332 caused by the X-direction drive section 331, the Y-direction drive section 333, and the raising and lowering drive section 338 is measured with high precision using an interferometer or the like. Furthermore, the X-direction drive section 331 and the Y-direction drive section 333 may have a two-stage configuration including a coarse moving section and a fine moving section. In this way, it is possible to realize both high-precision alignment and high throughput, and to perform precise and high-speed bonding of the substrate 210 mounted on the lower stage 332.

A microscope 334 and the activation apparatus 336 are further mounted on the Y-direction drive section 333, at the side of the lower stage 332. The microscope 334 can monitor the bottom surface of the substrate 210 that is held by the upper stage 322 and faces downward. The activation apparatus 336 generates plasma for cleaning the bottom surface of the substrate 210 held by the upper stage 322.

The aligner 300 may further include a rotational drive section that rotates the lower stage 332 around a rotational axis perpendicular to the bottom plate 312, and a rocking drive section that rocks the lower stage 332. In this way, the lower stage 332 can be made parallel to the upper stage 322 and the substrate 210 held by the lower stage 332 can be rotated, thereby increasing the alignment precision of the substrate 210.

The control section 150 calibrates the microscopes 324 and 334 relative to each other in advance. As shown in FIG. 4, the microscopes 324 and 334 are calibrated by aligning the focal points of the microscopes 324 and 334 with each other. In this way, the relative positions of the pair of microscopes 324 and 334 in the aligner 300 are measured.

Figure 5:
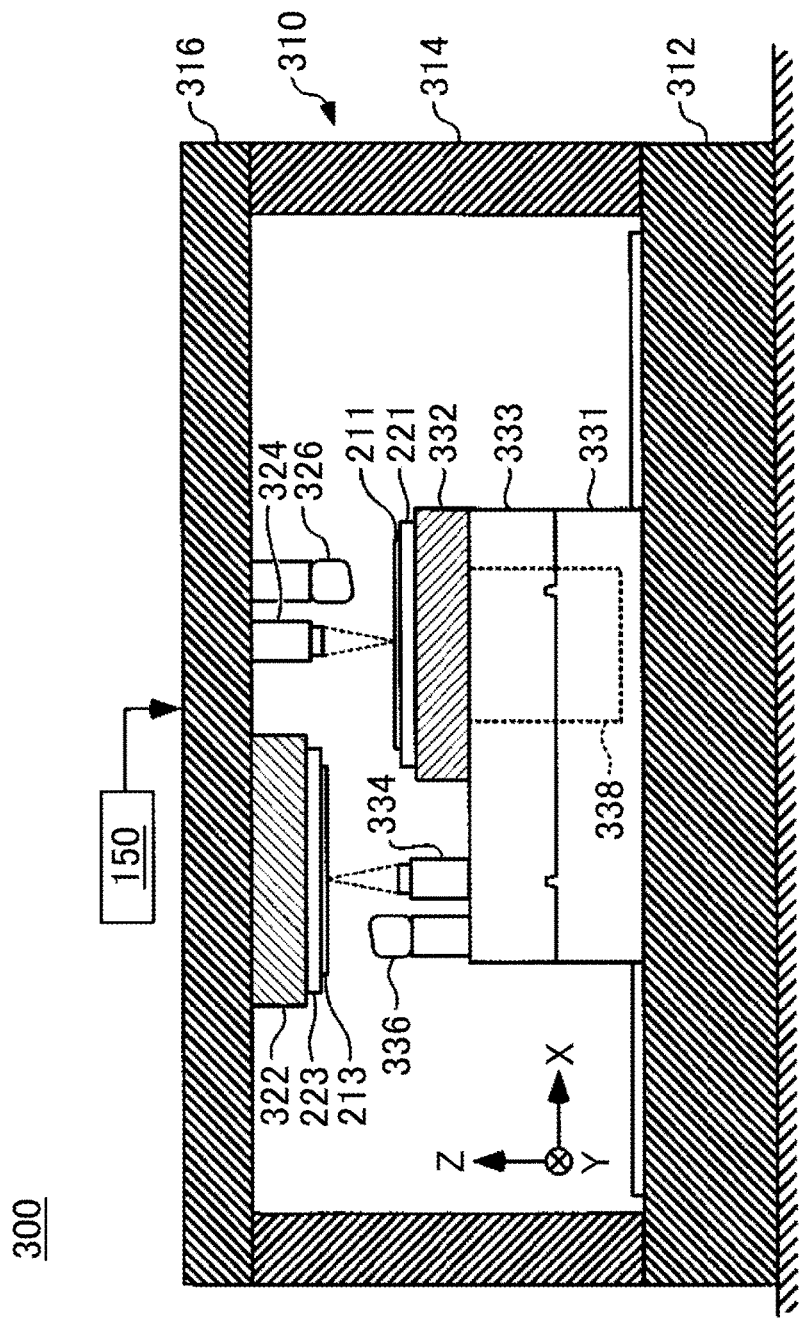
FIG. 5 is a schematic cross-sectional view of the aligner 300.

Next, as shown in FIG. 5, the control section 150 operates the X-direction drive section 331 and the Y-direction drive section 333 to detect alignment marks 218 provided on each of the substrates 211 and 213 using the microscopes 324 and 334 (step S103 in FIG. 3). The alignment marks 218 are detected by monitoring the surfaces of the substrates 210 with the microscopes 324 and 334. In this way, by detecting the alignment marks 218 on each of the substrates 210 using microscopes 324 and 334 whose relative positions are already known, the relative positions of the substrates 211 and 213 are determined (step S104). Accordingly, based on these relative positions, a state in which the substrates 211 and 213 can be aligned with each other is realized.

Figure 6:
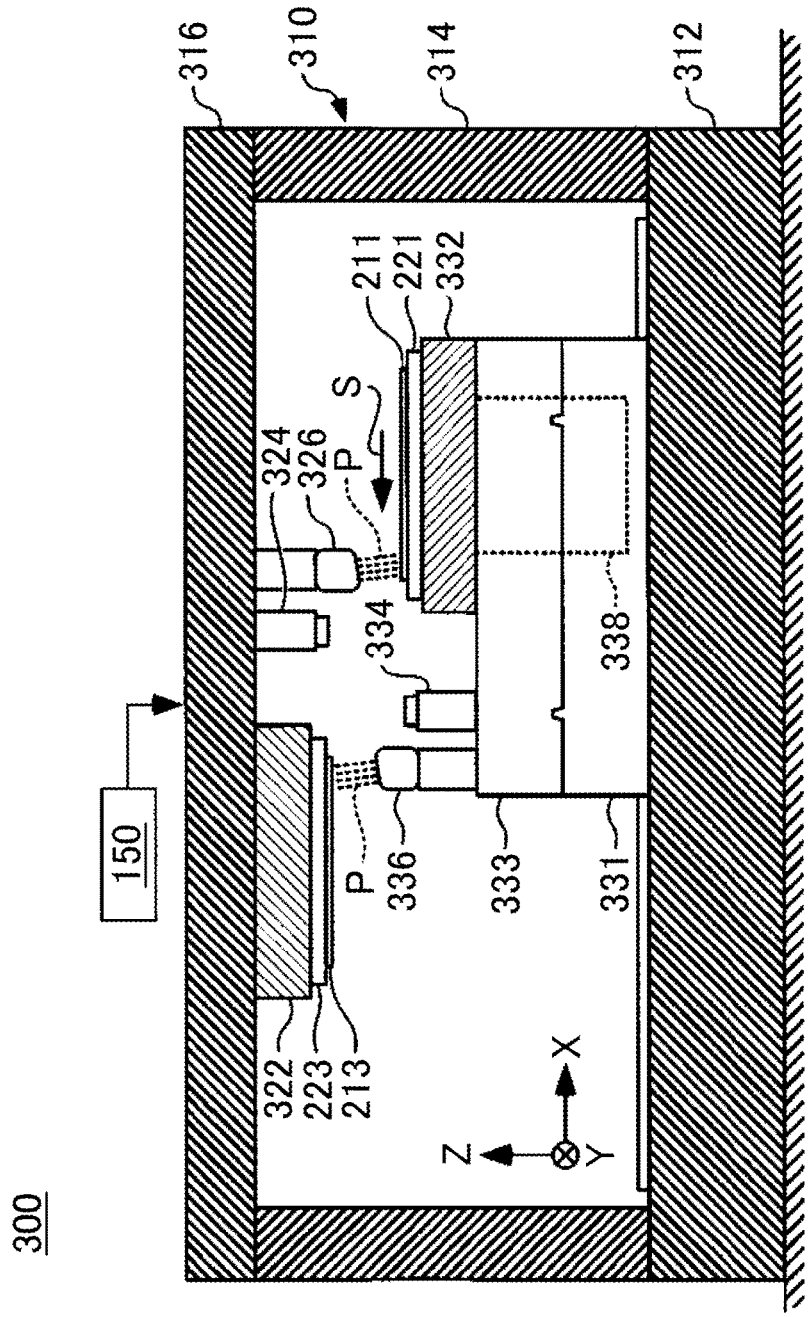
FIG. 6 is a schematic cross-sectional view of the aligner 300.

Next, as shown in FIG. 6, the control section 150 chemically activates each bonding surface of the pair of substrates 210, while keeping the relative positions of the pair of substrates 211 and 213 stored (step S105 in FIG. 3). First, the control section 150 operates the lower stage 332 to move horizontally after resetting the position of the lower stage 332 to the initial position, and causes the surfaces of the substrates 211 and 213 to be scanned using the plasma generated by the activation apparatuses 326 and 336. In this way, the surface of each substrate 211 and 213 is cleaned and the chemical activity thereof is increased. Therefore, a state is realized in which the substrates 211 and 213 are attracted bonded autonomously just by approaching each other.

In the example described above, the substrate 210 held by the lower stage 332 is exposed to the plasma P generated by the activation apparatus 326 supported on the top plate 316, thereby cleaning the surface of the substrate 210. Furthermore, the substrate 210 held by the upper stage 322 is exposed to the plasma. P generated by the activation apparatus 336 mounted on the Y-direction drive section 333, thereby cleaning the surface of the substrate 210.

The activation apparatuses 326 and 336 radiate the plasma. P respectively in directions away from the microscopes 324 and 334. In this way, debris generated from the substrates 210 being irradiated with the plasma is prevented from contaminating the microscopes 324 and 334.

Furthermore, the aligner 300 shown in the drawing includes the activation apparatuses 326 and 336 for activating the substrates 210, but by carrying substrates 210 that have already been activated into the aligner 300 using activation apparatuses 326 and 336 provided separately from the aligner 300, the aligner 300 can have a configuration that omits the activation apparatuses 326 and 336.

Furthermore, instead of a method using exposure to plasma, the substrates 210 can be activated through sputter etching using an inert gas, an ion beam, a high-speed atom beam, or the like. If an ion beam or high-speed atom beam is used, the beam can be generated with the aligner 300 at reduced pressure. Yet further, the substrates 210 can be activated using ultraviolet radiation, an ozone asher, or the like. In addition, the surfaces of the substrates 210 may be activated by being chemically cleaned, using a liquid or gaseous etchant, for example.

Figure 7:
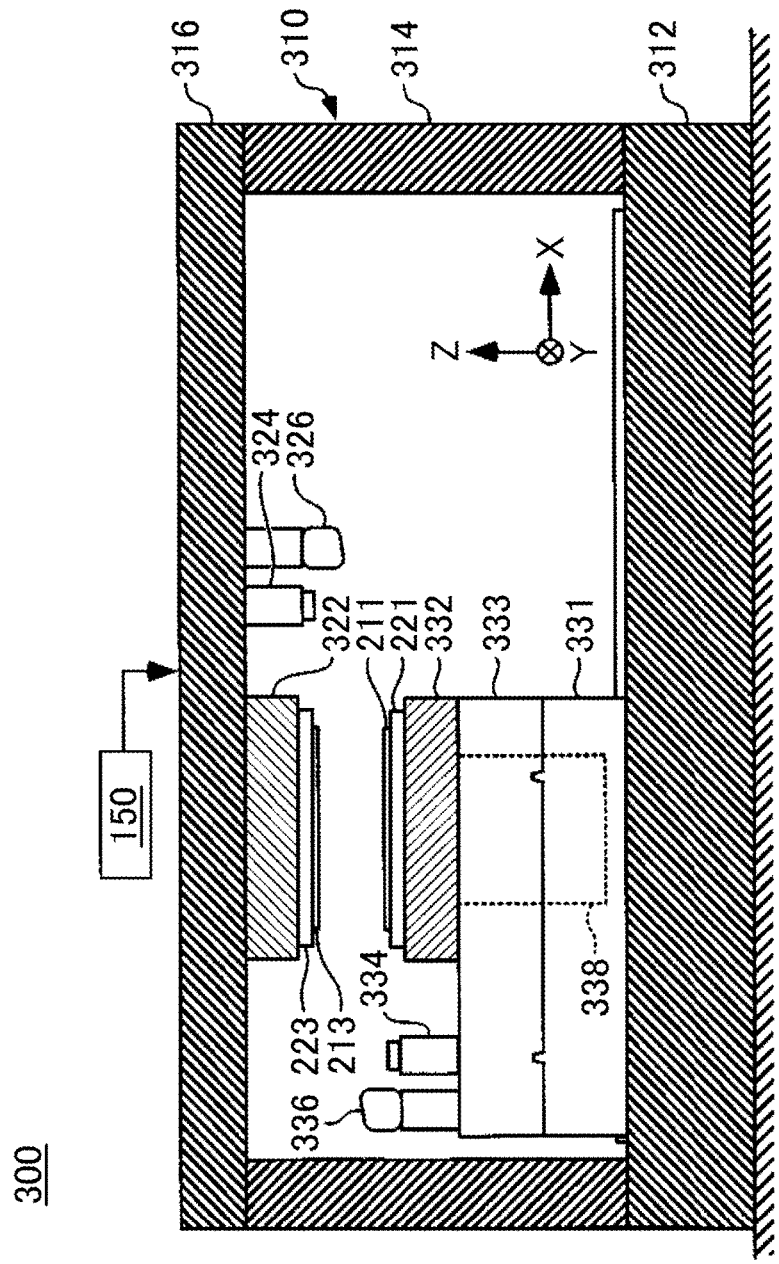
FIG. 7 is a schematic cross-sectional view of the aligner 300.

Next, as shown in FIG. 7, the control section 150 aligns the substrates 211 and 213 with each other (step S106 of FIG. 3). First, the control section 150 operates the lower stage 332 to move in a manner to match the positions of the alignment marks 218 of the substrates 211 and 213 in the surface direction, based on the relative positions of the microscopes 324 and 334 detected initially and the positions of the alignment marks 218 of the substrates 211 and 213 detected at step S103.

Figure 8:
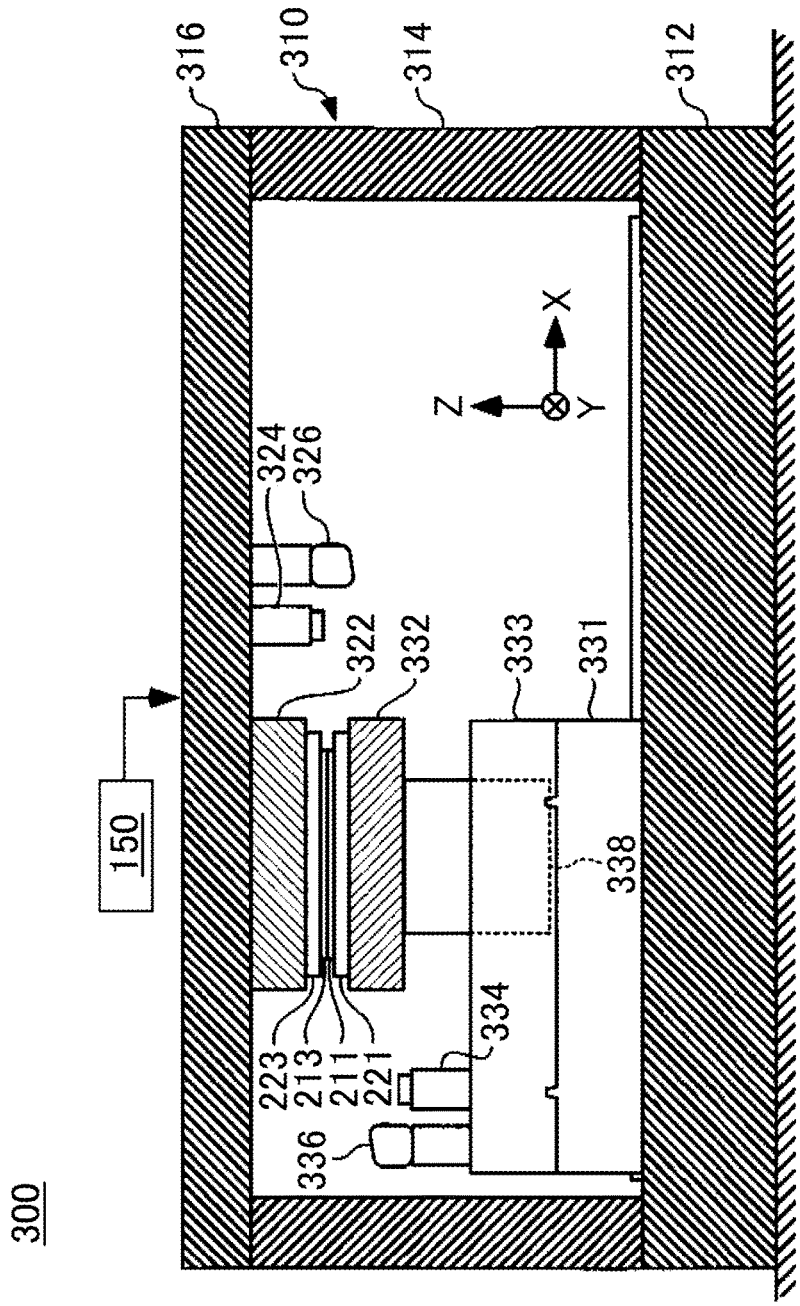
FIG. 8 is a schematic cross-sectional view of the aligner 300.

Next, as shown in FIG. 8, the control section 150 operates the raising and lowering drive section 338 to raise the lower stage 332, thereby bringing the substrates 211 and 213 into contact with each other (step S107). In this way, the substrates 211 and 213 are brought into contact with each other at one portion and bonded.

Furthermore, since the surfaces of the substrates 211 and 213 are activated, when the substrates 211 and 213 contact each other at one portion, adjacent regions thereof are autonomously attracted and bonded to each other due to the intermolecular force between the substrates 211 and 213. Accordingly, as an example, by releasing the hold on the substrate 213 by the upper stage 322, contact regions of the substrates 211 and 213, i.e. the regions where the substrates 211 and 213 are bonded, sequentially expand to adjacent regions. As a result, a bonding wave is generated in which the bonded regions sequentially expand, and the bonding of the substrates 211 and 213 progresses. In other words, the bonding progresses due to the boundary between the contact regions and the non-contact regions of the substrates 211 and 213 moving toward the non-contact regions. Finally, the substrates 211 and 213 contact across the entirety of their surfaces, and are bonded together (step S108 of FIG. 3). As a result, the substrates 211 and 213 form the layered structure substrate 230.

In the process described above by which the bonding regions between the substrates 211 and 213 expands, the control section 150 may release the hold on the substrate 213 by the substrate holder 223. Furthermore, the hold on the substrate holder 223 by the upper stage 322 may also be released.

Furthermore, the bonding between the substrates 211 and 213 may be made to progress by releasing the substrate 211 from the lower stage 332 without releasing the substrate 213 from the upper stage 322. Yet further, the substrates 211 and 213 may be bonded by bringing the upper stage 322 and the lower stage 332 closer together while keeping both the substrates 213 and 211 held by the upper stage 322 and the lower stage 332.

The layered structure substrate 230 formed in this way is carried out of the aligner 300 by the transfer robot 140 (step S109), and housed in the substrate cassette 130. When the substrate holder 223 releases the hold on the upper substrate 213, this substrate holder 223 continues being held by the upper stage 322.

In the step of carrying the layered structure substrate 230 out of the aligner 300, there are cases where the substrate holder 221 held by the lower stage 332 still holds the substrate 211. Accordingly, in such a case, the substrate holder 221 is carried out along with the layered structure substrate 230, and the layered structure substrate 230 may be transferred to the substrate cassette 130 after the layered structure substrate 230 and the substrate holder 221 are separated in the pre-aligner 500.

Figure 9:
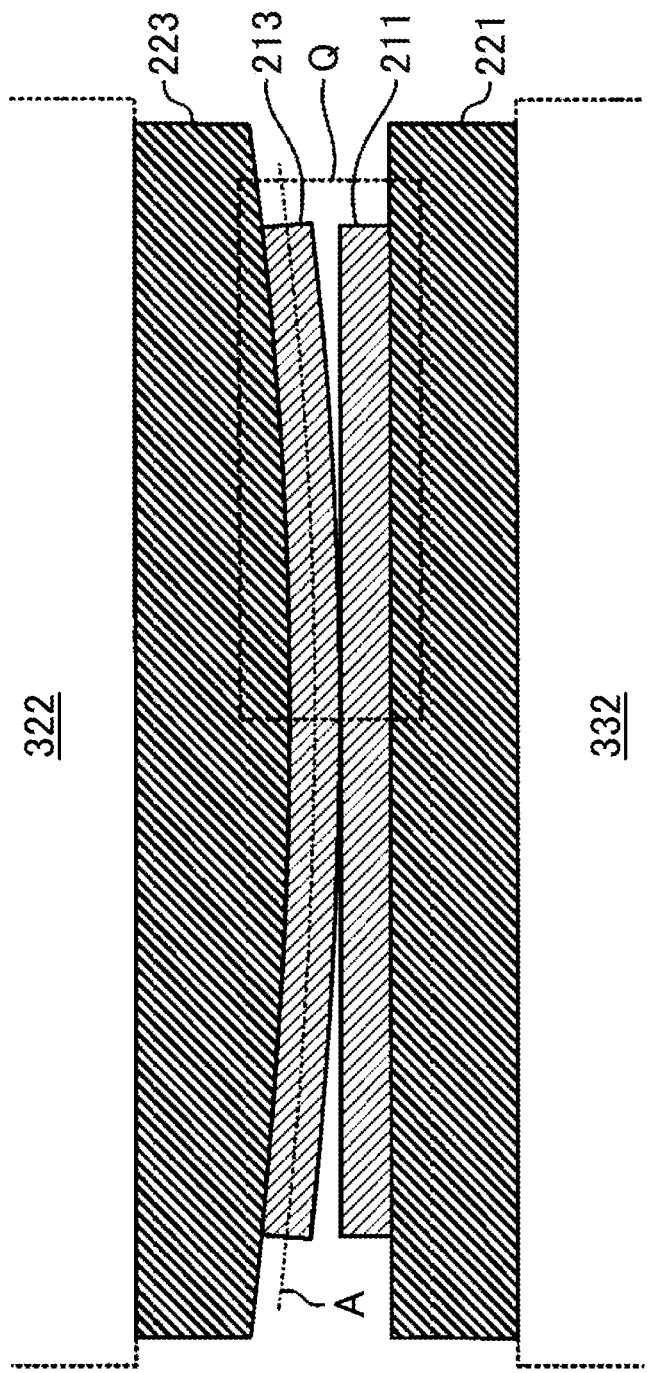
FIG. 9 is a schematic cross-sectional view of the process of stacking the substrates 211 and 213.

FIG. 9 shows a state of the substrates 211 and 213 in the process of stacking by the aligner 300 such as described above. FIG. 9 shows a state at the time when the substrates 211 and 213 begin to contact each other in step S107 of FIG. 3.

The substrate holders 222 and 223 include electrostatic chucks or the like, and respectively hold the substrates 211 and 213 by attracting the entirety of the corresponding substrate thereto. Accordingly, when the holding surface is flat such as that of the substrate holder 222 shown in the bottom portion of the drawing, the substrate 211 is held flat. Furthermore, when the holding surface forms a round surface, e.g. a cylindrical surface, a spherical surface, a parabolic surface, or the like such as the substrate holder 223 shown in the top portion of the drawing, the substrate 213 attracted thereto is also deformed to form such a curved surface.

By performing bonding in a state where at least one of the substrates 211 and 213 is deformed such that the inner sides thereof protrude in the surface direction of the substrates 211 and 213 protrude, such as described above, the bonding between the substrates 211 and 213 progresses from the inner sides to the outer sides in the surface direction of the substrates 211 and 213. In this way, air bubbles (voids) or the like are prevented from remaining inside the layered structure substrate 230 formed by the bonding.

Furthermore, in a case where one of the substrates 211 and 213 continues to be held and the other is released in the stacking of the substrates 211 and 213, it is preferable that whichever of the substrates 211 and 213 is predicted to have a stretching amount with a greater and/or a more complex amount of unevenness and/or to have structures with higher anisotropy continues to be held, while the other is released to perform stacking. In this way, the correction of the misalignment of the circuit region 216 is more easily reflected in the layered structure substrate 230.

Furthermore, in the stacking of the substrates 211 and 213, the substrates 211 and 213 may continue to be held by the aligner 300 until the bonding of the substrates 211 and 213 is completed. In this case, the substrates 211 and 213 are pressed together across the entirety of the surfaces thereof, while the positioning of the substrates 211 and 213 by the substrate holders 221 and 223 or the stages holding the substrates 211 and 213 is maintained.

Figure 10:
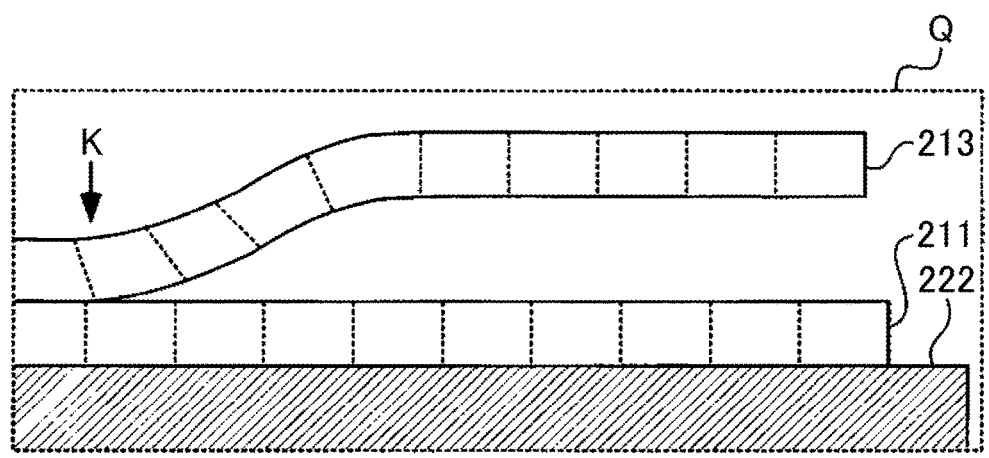
FIG. 10 is a schematic view of the substrates 211 and 213 in the stacking process.
Figure 11:
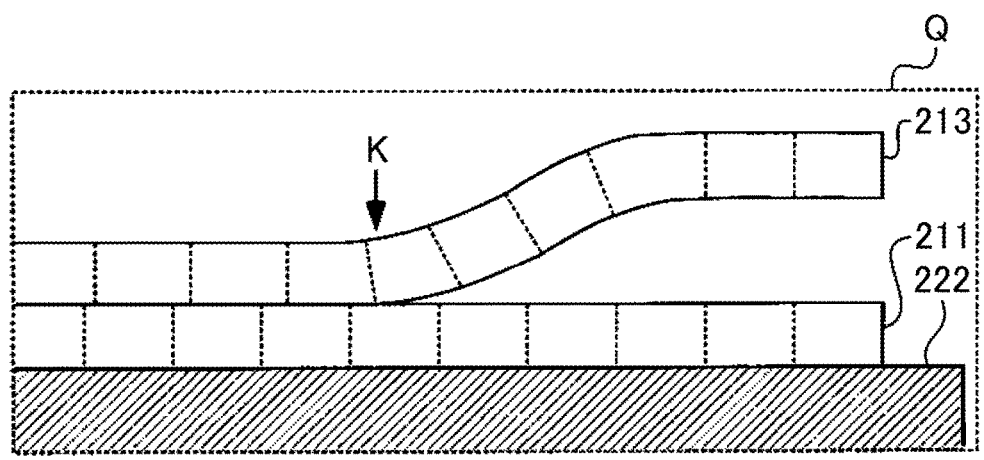
FIG. 11 is a schematic view of the substrates 211 and 213 in the stacking process.
Figure 12:
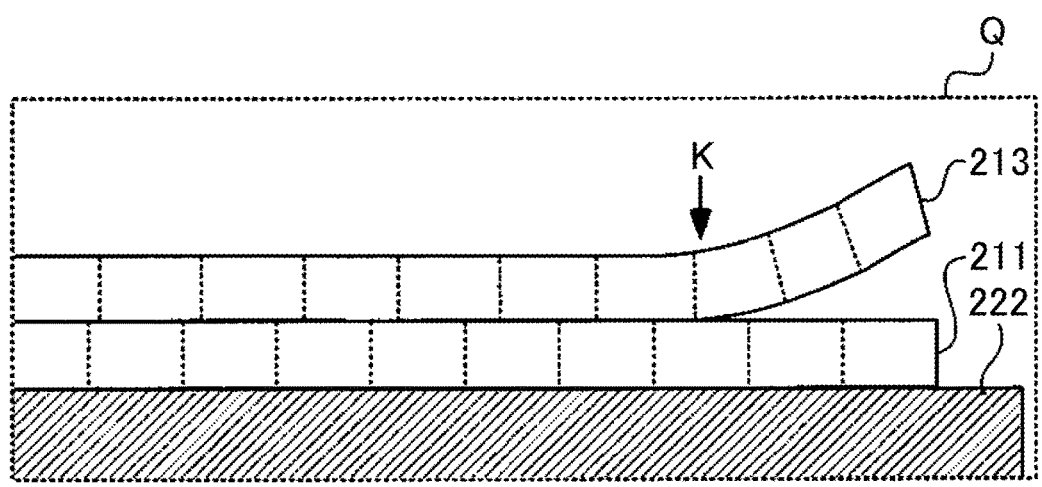
FIG. 12 is a schematic view of the substrates 211 and 213 in the stacking process.

FIGS. 10 to 12 are drawings showing the change of the state during the process of stacking the substrates 211 and 213 shown in FIG. 9, and correspond to the region shown by the dotted line Q in FIG. 9. During the process in which the stacking progresses in step S108, the boundary K between the contact region where the substrates 211 and 213 are stacked on each other and the non-contact region where the substrates 211 and 213 are still distanced from each other but will become stacked moves from the centers of the substrate 211 and 213 toward the edge portions.

Therefore, at the boundary K, stretching deformation unavoidably occurs in the substrate 213 that has been released from the holding by the substrate holder 223. More specifically, at the boundary K, the substrate 213 stretches at the bottom surface side of the substrate 213 in the drawing and contracts at the top surface side of the substrate 213 in the drawing, relative to the surface A at the center of the substrate 213 in the thickness direction.

FIG. 11 shows a state in which, from the state shown in FIG. 10, the boundary K has moved toward the edge portions of the substrates 211 and 213, from the same viewpoint as in FIG. 10. The substrate 213 contacting the substrate 211 has a contact surface area that gradually expands from the center portion where the initial contact occurs toward the edge portion that was initially distanced from the lower substrate 211.

Furthermore, as shown by the dotted lines in the drawing, the substrate deforms as if the scaling factor of the surface of the substrate 213 is expanding relative to the substrate 211, at the outer end of the region of the substrate 213 bonded to the substrate 211. Therefore, appearing as a skew in the dotted lines in the drawing, misalignment due to the different extension amount of the substrate 213 in the surface direction thereof occurs between the lower substrate 211 held by the substrate holder 222 and the upper substrate 213 released from the substrate holder 223. In other words, the amount of deformation of the substrate 213 differs according to the expansion direction of the contact region between the substrates 211 and 213 and, due to this difference in the amount of deformation, the misalignment occurs between the substrates 211 and 213. The expansion direction of the contact region includes a direction that is perpendicular to the tangent of the boundary of the contact region, a direction of this tangent, and a direction along this boundary, and if the substrates 211 and 213 make contact from the centers, this expansion direction also includes a radial direction and a circumferential direction of the substrates 211 and 213.

FIG. 12 shows a state in which, from the state shown in FIG. 11, the bonding of the substrate 213 to the substrate 211 progresses further, and the bonding of the substrates 211 and 213 approaches completion. When the activated surfaces of the substrates 211 and 213 contact each other, the substrates are bonded together and form a single body. Therefore, at the bonding interface, the misalignment occurring between the substrates 211 and 213 is secured by the bonding.

Figure 13:
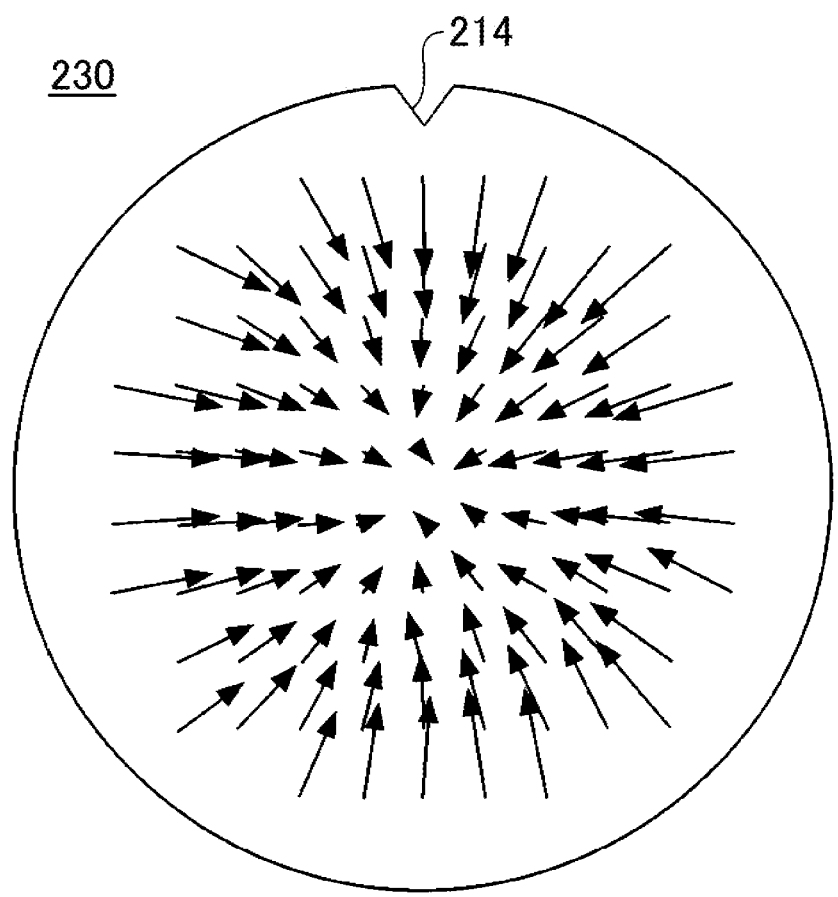
FIG. 13 shows misalignment in the layered structure substrate 230.

FIG. 13 shows the misalignment amount of the substrate 211 relative to the substrate 213 in the layered structure substrate 230 manufactured by stacking the substrates 211 and 213 using a process such as described above. In the drawing, the direction of the arrows indicates the direction of the misalignment and the length of the arrows indicates the magnitude of the misalignment. As shown in the drawing, the misalignment between the substrates 211 and 213 occurs across substantially the entire surface of the layered structure substrate 230, and furthermore, the misalignment amount is greater closer to the edge portion of the layered structure substrate 230.

Therefore, the misalignment amount changes and does not remain uniform over the entirety of the substrates 211 and 213. Accordingly, even if the alignment of the entirety of the substrates 211 and 213 is adjusted in step S106 shown in FIG. 3, it is impossible to eliminate the misalignment in the entirety of the substrates 211 and 213 caused by this uneven stretching amount.

As a reason for unevenness occurring in the amount of deformation, there are the following problems in addition to the rigidity distribution in the substrates. If connecting portions made from metal such as Cu, for example, are embedded in the oxide film layers formed on the surfaces of the substrates, a difference occurs between the intermolecular force acting between the oxide films and the intermolecular force acting between the connecting portions in the two substrates during bonding, thereby causing a change in the degree of progression, i.e. the progression speed and the progression amount, of the bonding wave. In particular, when the surfaces of the connecting portions are positioned lower than those of the oxide films, the attractive force between the connection portions becomes weaker and the progression of the bonding wave becomes slower.

A method for preventing this problem can be exemplified by arranging the connecting portions on the line of the boundary K shown in FIG. 10 to match the timings at which the bonding wave passes through the plurality of connecting portions. It is also possible to control the progression speed of the bonding wave by arranging dummy connecting portions that are not targets of electrical bonding. Furthermore, if the substrates have a rigidity distribution, the connecting portions and dummy connecting portions may be arranged in consideration of this rigidity distribution.

Figure 14:
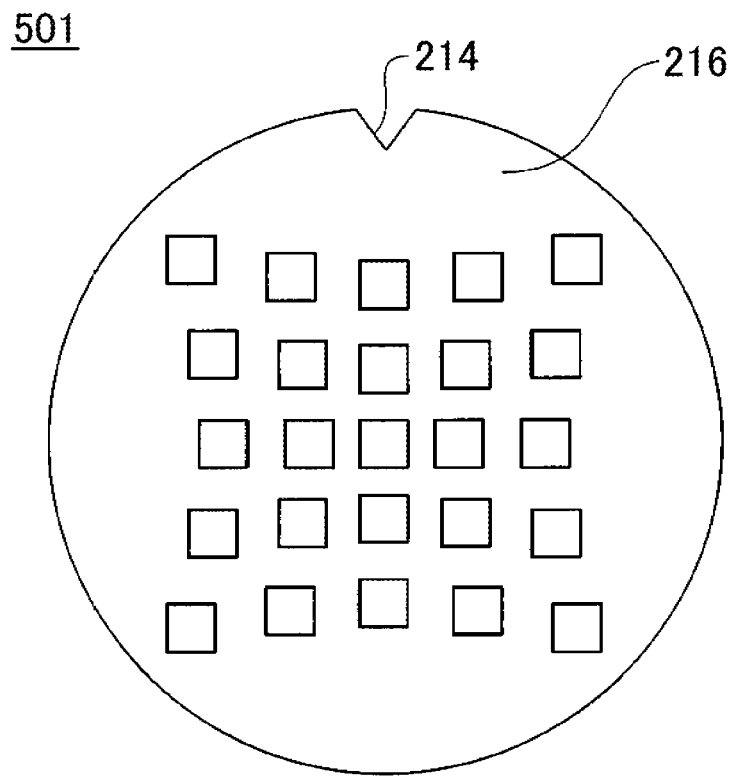
FIG. 14 is a schematic view of the correction method for the substrate 210.

FIG. 14 is a schematic view of a layout of a substrate 501 obtained by altering the substrate 211, with the objective of correcting the misalignment described above when stacking the substrate 501 on the substrate 211. In the substrate 501, when forming the circuit regions 216 across the entire substrate 501 by repeatedly performing exposure using the same mask, the shot map is corrected such that the intervals between the circuit regions 216 become gradually wider from the center of the substrate 501, which is the position of contact with the substrate 211, toward the edge portion thereof.

In this way, the misalignment occurring when the substrate 501 is bonded to the substrate 213 is corrected by the layout of the substrate 501 itself, and misalignment of circuits is restricted across the entire layered structure substrate 230. Accordingly, it is possible to improve the yield of layered semiconductor devices obtained after dicing the layered structure substrate 230 manufactured by layering the substrate 213 and the substrate 501.

Figure 15:
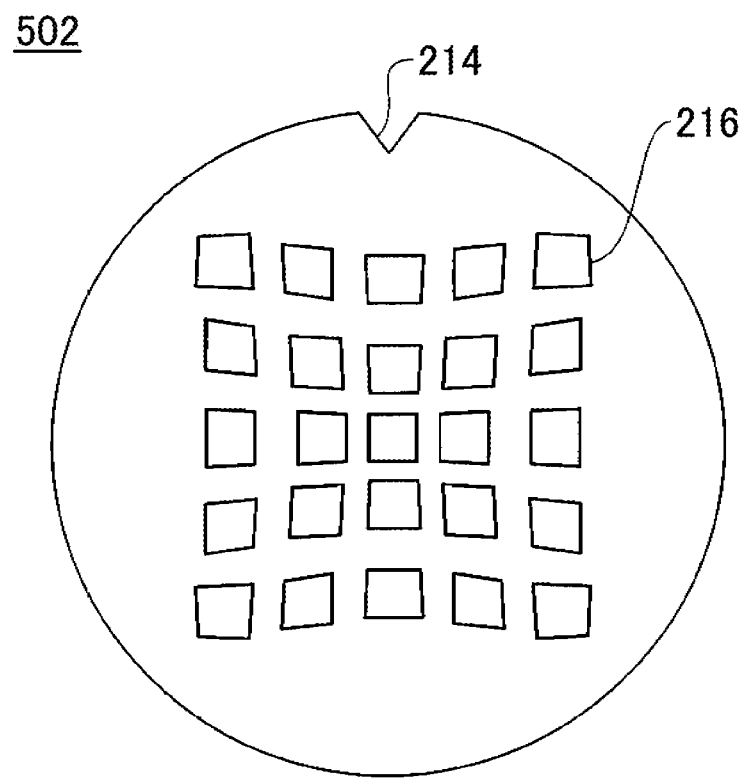
FIG. 15 is a schematic view of the correction method for the substrate 210.

FIG. 15 is a schematic view of a layout of a substrate 502 obtained by altering the substrate 211, with the objective of correcting the misalignment described above when stacking the substrate 502 on the substrate 211. In the substrate 502, when forming the circuit regions 216 across the entire substrate 502 by repeatedly performing exposure using the same mask, the exposure pattern is optically controlled such that the scaling factor of the structures on the substrate 502 becomes gradually higher from the center of the substrate 502, which is the position of contact with the substrate 213, toward the edge portion thereof, i.e. along the progression direction of the bonding wave. The progression direction of the bonding wave includes a direction along the radial direction of the substrates 211 and 213, among the expansion directions of the contact regions of the substrates 211 and 213. Therefore, in the substrate 502, the scaling factor of the structures on the surface of the substrate 502 becomes higher closer to the edge portion of the substrate 502.

In this way, the misalignment occurring when the substrate 502 is bonded to the substrate 213 is corrected by the layout of the substrate 502 itself, and misalignment of circuits is restricted across the entire layered structure substrate 230. Accordingly, it is possible to improve the yield of layered semiconductor devices obtained after dicing the layered structure substrate 230 manufactured by layering the substrate 213 and the substrate 502.

In the examples of FIGS. 14 and 15, the amount of deformation in the 45° direction of the substrate 501 is greater than the amount of deformations in the 0° direction and the 90° direction, and therefore the shot interval in the 45° direction is adjusted. However, if the amount of deformation of the substrate 501 is equal or almost equal in all directions, the shot interval and shot shape can be adjusted in all directions in the same manner. Furthermore, in FIGS. 14 and 15, if a plurality of chips are formed in a single shot, the shapes of and intervals between the plurality of chips in the single shot may be adjusted in a manner to change from the center of the substrate 501 or substrate 502 toward the edge portion thereof.

Furthermore, if the amount of deformation in a certain direction is greater than the amount of deformation in another direction in the substrate 502, for example, the difference in the amounts of deformation may be corrected by exposing the substrate in a state where deformation has occurred in a manner to correct the difference in the amounts of deformation, and eliminating the deformation after the exposure. For example, if the top side in the drawing at which the notch 214 is provided is 0°, when it is judged that the amount of deformation in the radial direction every 45° is greater than the amount of deformation in another direction, the pattern of the circuit region 216 is transferred by performing exposure in a state where the substrate 502 contracts in each radial direction including 45°, 135°, 225°, and 315° using a actuator or the like.

Here, when causing the substrate 502 to contract, it is possible to prevent the occurrence of misalignment of the circuit regions 216 due to the exposure, by causing the substrate 502 to contract while staying in a flat state. Such a contraction method can include, for example, causing the substrate 502 to contract in a state where the substrate holder is deflected, and then releasing the substrate holder from the deflected state and returning the substrate holder to the flat state, thereby causing the substrate 502 to contract in a flat state as a result.

After this, it is possible to correct the amount of deformation of the substrate 502 in a prescribed radial direction by releasing the deformation of the substrate 502 by the actuator to remove the contraction of the substrate 502. The amount of deformation of the substrate 502 in the exposure is determined according to the correction amount to be achieved in the substrate 502.

The correction for a region corresponding to a progression direction in which the amount of deformation of the substrate 213 is large is performed using a region corresponding to a progression direction in which the amount of deformation is small as a reference, but the correction for a region with a small amount of deformation may be performed using a region with a large amount of deformation as a reference. Furthermore, correction is performed for misalignment occurring in a region having an amount of deformation for which the difference relative to a reference amount of deformation is greater than or equal to a prescribed value. In this case, the prescribed value is the value occurring when the electrical connection between the connecting portions of two substrates is lost due to misalignment, and the connecting portions are connected to each other when the difference is less than the prescribed value.

Figure 16:
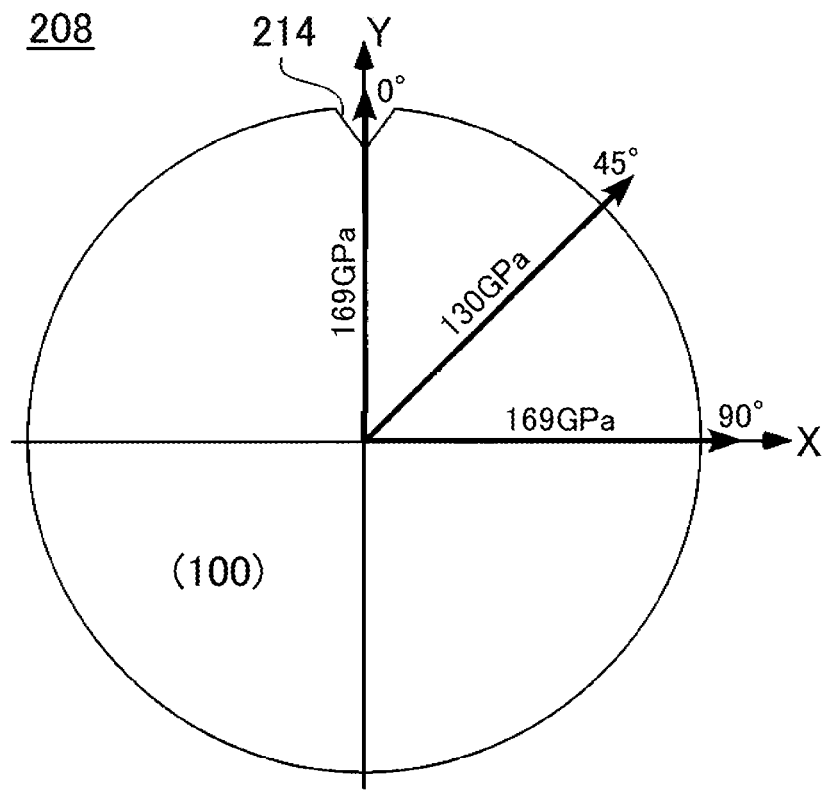
FIG. 16 is a schematic view of the correction method for the silicon single-crystal substrate 208.
Figure 17:
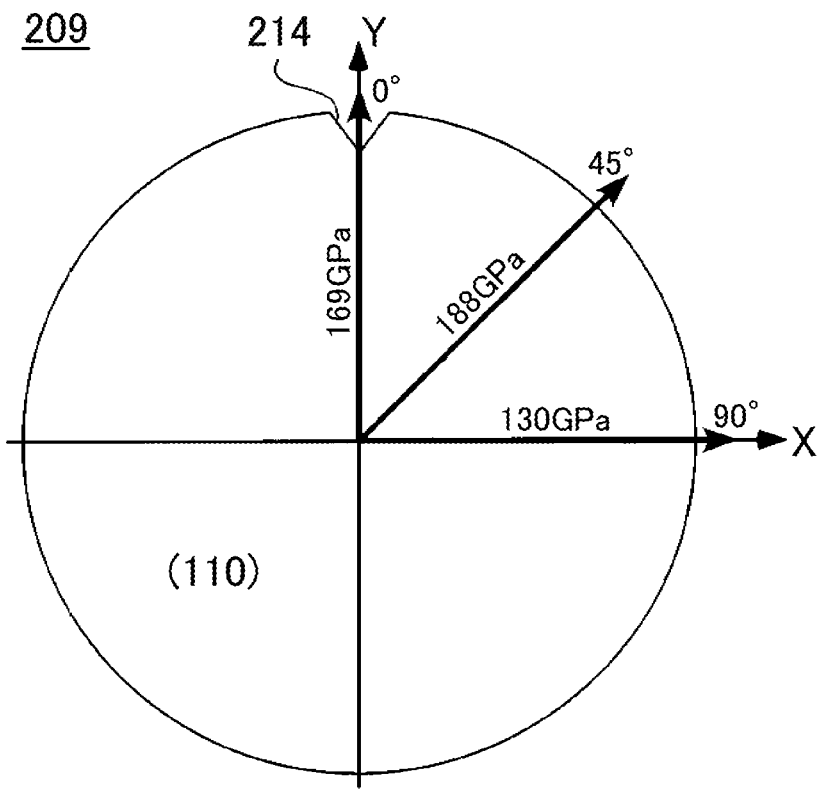
FIG. 17 is a schematic view of the correction method for the silicon single-crystal substrate 208.

It should be noted that the unevenness in the stretching amount that results in the misalignment of the circuit regions 216 in the substrates 211 and 213 also occurs because of factors different from the changes dependent on the radial direction between the substrates 211 and 213. FIGS. 16 and 17 show exemplary relationships of the crystal orientation and Young's modulus in silicon single-crystal substrates 208 and 209.

As shown in FIG. 16, in the silicon single-crystal substrate 208 having the (100) surface as the front surface, at the X-Y coordinates where the direction of the notch 214 is at 0° relative to the center, there is a high Young's modulus of 169 GPa at the 0° direction and the 90° direction, and a low Young's modulus of 130 GPa at the 45° direction. Therefore, in the substrate 210 manufactured using the silicon single-crystal substrate 208, an uneven bending rigidity distribution occurs in the circumferential direction of the substrate 210. In other words, the bending rigidity of the substrate 210 differs according to the progression direction when the bonding wave progresses from the center of the substrate 210 toward the edge portion. The bending rigidity indicates the ease of deformation relative to the bending force applied to the substrate 210, and may be the modulus of elasticity.

In the regions having different bending rigidities in the substrate 210 shown in FIG. 2, the magnitude of the deformation occurring in the process of stacking and bonding the pair of substrates 211 and 213 differs according to the bending rigidity, as described with reference to FIGS. 10 to 12. Therefore, in the layered structure substrate 230 manufactured by layering the substrates 211 and 213, uneven misalignment of the circuit regions 216 occurs in the circumferential direction of the layered structure substrate 230.

Furthermore, as shown in FIG. 17, in the silicon single-crystal substrate 209 having the (110) surface as the front surface, at the X-Y coordinates where the direction of the notch 214 is at 0° relative to the center, Young's modulus at the 45° direction is the highest, and Young's modulus at the 0° direction is the next highest. Furthermore, in the 90° direction, Young's modulus of the silicon single-crystal substrate 209 is the lowest. Therefore, in the substrate 210 manufactured using the silicon single-crystal substrate 209, an uneven and complex bending rigidity distribution occurs in the circumferential direction of the substrate 210. Accordingly, in the same manner as the silicon single-crystal substrate 208 shown in FIG. 16, when performing manufacturing by layering the substrates 211 and 213, uneven misalignment of the circuit regions 216 occurs in the circumferential direction of the layered structure substrate 230.

In this way, when manufacturing the layered structure substrate 230 by stacking the substrates 211 and 213 manufactured using the silicon single-crystal substrates 208 and 209, misalignment of the circuit regions 216 occurs due to the uneven stretching amount in the circumferential direction. Accordingly, before stacking and bonding the substrates 211 and 213, the misalignment of the circuit regions 216 due to the uneven stretching amount of the substrates 211 and 213 is corrected.

In FIGS. 16 and 17, examples are shown in which the direction of the notch 214 is arranged at the position of 0°, but the position of the notch 214 only needs to be arranged in a manner to enable identification of the crystal orientation of the silicon single-crystal substrates 208 and 209, and only needs to be arranged at a prescribed position relative to the crystal direction. Furthermore, the X-Y coordinates are set using the notch 214 as a reference, but the X-Y coordinates may be set using the crystal direction of the silicon single-crystal substrates 208 and 209 itself as a reference. Yet further, in FIGS. 16 and 17, the bending rigidity of the silicon single-crystal substrates 208 and 209 in the 0°, 45°, and 90° directions are shown, but when a silicon single-crystal substrate whose crystal orientation does not match the 0°, 45°, or 90° directions is used, for example, the bending rigidity relative to the crystal orientation may be used.

In the manner described above, when substrates 211 and 213 having anisotropic stretching amounts are stacked in a state where the substrates 211 and 213 are held by the substrate holders 221 and 223 or the stages of the aligner 300, the crystal orientations of the substrates 211 and 213 may be made different from each other. For example, the circuit regions 216 may be formed with arrangements shifted by 45° on substrates having the same crystal orientation, and stacking may be performed. In this way, the shift of the circuit regions 216 caused by the anisotropy of the rigidities of the substrates 211 and 213 is not manifested as a misalignment just by a directional rotation of 45°. Furthermore, the circuit regions may be formed on substrates 211 and 213 having different crystal orientations from each other, and stacking may be performed. In this way, other non-linear shifts that are dependent on the crystal orientation or the like can be corrected by shifting the crystal orientations according to the combination.

Variation in the thicknesses of the substrates 211 and 213 is another cause of unevenness in the stretching amounts of the substrates 211 and 213. In the substrates 211 and 213, a thick region has high bending rigidity, while a thin region has low bending rigidity. Therefore, when stacking the substrates 211 and 213 without performing a correction, misalignment of the circuit regions 216 occurs due to the unevenness of the stretching amount corresponding to the thickness distribution.

Furthermore, the structures of the circuit regions formed on the substrates 211 and 213 also affect the bending rigidity of the substrates 211 and 213. In the substrates 211 and 213, the circuit regions 216 in which elements, wiring, protective films, and the like are deposited have higher bending rigidity than the scribe lines 212 where nothing is formed other than the alignment marks 218. The scribe lines 212 are formed in a lattice shape on the substrates 211 and 213, and therefore have low rigidity with respect to bending caused by folds parallel to the scribe line 212 and have high rigidity with respect to bending caused by folds that intersect the scribe lines 212.

In this way, unevenness in the stretching amount when stacking the substrates also occurs due to the structures formed on the surfaces of the substrates 211 and 213. In other words, it is also possible to correct the unevenness of the bending rigidity of the substrates 211 and 213 by using the layout of the structures on the substrates 211 and 213.

For example, it is possible to reinforce the bending rigidity by arranging the connecting portions such as the dummy pads, bumps, and the like in empty regions of the substrates 211 and 213. Furthermore, it is possible to correct the unevenness of the bending rigidity by adjusting the density and arrangement of the structures such as bumps, circuits, and the like within a single chip. For example, the density of the structures in a chip formed in a region with high bending rigidity is made low, and the density of the structures in a chip formed in a region with low bending rigidity is made high.

It is also possible to reinforce the bending rigidity of a substrate by forming the protective films, insulating films, and the like even in regions where other elements, wiring, and the like are formed and adjusting the thickness, materials, and the like of these films. Furthermore, the anisotropy of the rigidities of the substrates 211 and 213 caused by the scribe lines 212 may be ameliorated by forming the scribe lines 212 with a shape other than a lattice formed by straight lines. Yet further, in the silicon single-crystal substrate 208 shown in FIG. 16, for example, when the shift amount, i.e. the amount of deformation, relative to the substrates being stacked is greater in the 0° and 90° directions due to the bending rigidity in the 45° direction being low, by changing the intervals and shapes of the shots and chips from the center of the silicon single-crystal substrate 208 toward the edge portion as shown in FIGS. 14 and 15, it is possible to correct the misalignment of the circuit regions 216 caused by the uneven stretching amounts of the substrates 211 and 213. In this way, it is possible to set the misalignment amount between the pair of substrates being stacked on each other to be within a prescribed range in which the circuits of the pair of substrates are to be bonded to each other.

There are cases where, in the substrates 211 and 213, the bending rigidity of each region differs according to the residual stress caused by the stress occurring in the process of forming the circuit region 216 or the like or the process of forming the oxide film of the substrate. Furthermore, when deformation such as warping occurs in the substrates 211 and 213 in the process of forming the circuit region 216, unevenness in the bending rigidity occurs in each region where warping occurs according to the deformation. The unevenness of the bending rigidity caused by the structures such as described above can also help with such correction of the unevenness of the bending rigidity caused by the states of the substrates 211 and 213 themselves.

The correction amount when correcting the misalignment may be obtained by, for example, manufacturing a test piece having the same specifications as the product using the substrate stacking apparatus 100 and measuring the misalignment amount occurring in the circuit regions 216. By performing the correction using the measurement value obtained in this way, it is possible to effectively perform a correction in accordance with the product.

There are cases where it is possible to cancel out the unevenness in the stretching amount in each of the substrates 211 and 213 and decrease the misalignment correction amount, by predetermining a combination of substrates 211 and 213 to be stacked on each other and correcting these substrates 211 and 213 relative to each other. On the other hand, it is also possible to eliminate restrictions on the combinations of substrates 211 and 213 to be stacked by correcting the misalignment in each of the substrates 211 and 213.

By detecting or measuring the rigidity distribution in advance for each of the substrates 211 and 213, alignment between substrates may be performed in a manner to, when aligning the substrates 211 and 213 on each other, cause the total values of the rigidities to be equal between the substrates or to cause the total rigidity value to be within a prescribed range. In this case, the structures such as the shots, chips, and circuits of one substrate in the pair of substrate being stacked on each other may be formed at positions according to the rigidity distribution based on the crystal anisotropy of the other substrate.

When stacking substrates that have the same or similar crystal orientations as each other, by performing stacking with regions having the same or almost the same bending rigidity or modulus of elasticity or regions between which the difference in the rigidity or modulus of elasticity is less than or equal to a prescribed threshold value are opposite each other, the difference in amount of deformation caused by the rigidity distribution is restricted from occurring between the substrates. Here, the prescribed threshold value is the value occurring when the electrical connection between the connecting portions of two substrates is lost due to misalignment between the two substrates caused by the difference in rigidity, and the connecting portions are connected to each other when the difference is greater than the threshold value. In this case, after the pair of substrates are made to partially contact each other in a state where the substrates are held by the stages or the substrate holders, the hold on both substrates in the pair is preferably released.

Furthermore, when non-linear scaling deformation occurs due to stress or the like occurring in one of the substrates during the circuit formation or oxide film formation, another substrate may be selected such that, as a result of the deformation state caused in the process of the bonding wave matching the one substrate, i.e. as a result of deformation, the position of the circuits of the other substrate match the positions of the circuits of the one substrate. In this way, by selecting substrates having rigidity distributions corresponding to a deformation state of a substrate that has an initial deformity, it is possible to restrict the misalignment between the substrates. In this case, it is preferable that the one substrate described above is secured to the stage or substrate holder and the hold on the other substrate is released, thereby bonding the other substrate to the one substrate.

An atmospheric pressure adjusting section that adjusts the atmospheric pressure around at least a pair of substrates 211 and 213 may be provided. The atmospheric pressure adjusting section can control the amount of deformation of at least one substrate in the pair of substrates 211 and 213, by adjusting the amount of gas that is present in the pair of substrates 211 and 213 according to the deformation distribution of the one substrate 211 in the pair of substrates 211 and 213. For example, when the pressure around the pair of substrates 211 and 213 is reduced, it is possible to reduce the pressure received from the gas present between the pair of substrates 211 and 213. In this way, it is possible to decrease the amount of deformation of the substrate 211 caused by this pressure. For example, in the silicon single-crystal substrate 208 shown in FIG. 16, when the shift amount, i.e. the amount of deformation, relative to the substrates being stacked is greater in the 0° and 90° directions due to the bending rigidity in the 45° direction being low, by reducing the pressure around the region in the 45° direction, it is possible to reduce the difference in the amount of deformation relative to the 0° and 90° regions.

Furthermore, by adjusting the degree of activation of at least one substrate in the pair of substrates 211 and 213, it is possible to restrict the unevenness of the amount of deformation caused by the rigidity distribution of the at least one substrate. For example, in the silicon single-crystal substrate 208 shown in FIG. 16, when the amount of deformation is greater in the 0° and 90° directions due to the bending rigidity in the 45° direction being low, the attractive force on the other substrate is improved compared to that of the regions by 0° and 90° directions by increasing the degree of activation of the region in the 45° direction. In this way, it is possible to adjust the amount of deformation of the region in the 45° direction. In this case, it is preferable to release the one substrate whose degree of activation was adjusted from the stage or substrate holder, and to hold the other substrate on the stage or substrate holder. The degree of activation is adjusted by adjusting the plasma irradiation time, the plasma irradiation amount, the elapsed time after activation, the type of plasma, or the like. In other words, it is possible to increase the degree of activation by increasing the irradiation time, increasing the irradiation amount, or decreasing the elapsed time.

Figure 18:
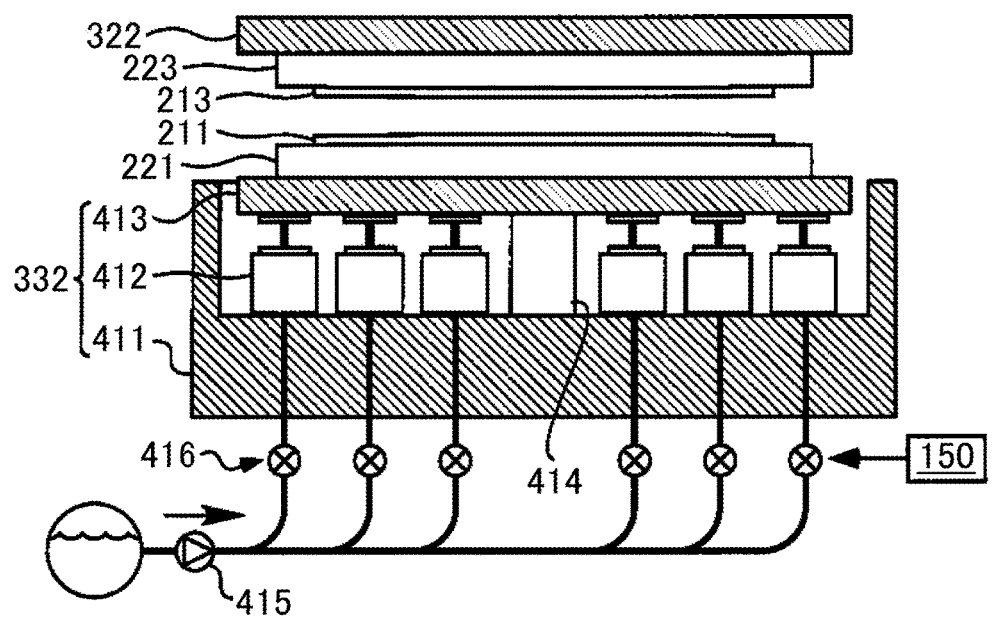
FIG. 18 is a schematic cross-sectional view of the correcting section 601.

Furthermore, in addition to the correction made for each of the substrates 211 and 213 as described above, a correction of the unevenness of the stretching amount of the substrates 211 and 213 can be made in the step where the substrates 211 and 213 are stacked as well. FIG. 18 is a schematic view of a correcting section 601 that can correct the unevenness of the stretching amount at the step of stacking the substrates 211 and 213, in the aligner 300. Furthermore, an optimal bonding solution may be used in consideration of the pattern arrangement of HOT (Hybrid-Orientation Technology) which considers the optimal surface orientation of PMOS and NMOS, which are CMOS configurational elements.

FIG. 18 is a schematic view of the correcting section 601 that can be used when correcting the substrates 211 and 213 in the aligner 300. The correcting section 601 is incorporated in the lower stage 332 in the aligner 300.

The correcting section 601 includes a base portion 411, a plurality of actuators 412, and an attracting section 413. The base portion 411 supports the attracting section 413 via the actuators 412. The plurality of actuators 412 are arranged in the surface direction of the lower stage 332, are provided individually with operational liquid via a pump 415 and valves 416 from the outside under the control of the control section 150, and individually extend and contract by different movement amounts.

The attracting section 413 has an attraction mechanism such as a vacuum chuck or electrostatic chuck, and attracts the substrate holder 221 holding the substrate 211 to the top surface thereof. In this way, the substrate 211, the substrate holder 221, and the attracting section 413 form a single body.

The attracting section 413 is coupled to the plurality of actuators 412 via links. The center of the attracting section 413 is coupled to the base portion 411 by a support column 414. When the actuators 412 are operated in the correcting section 601, each region coupled to an actuator 412 is displaced in the thickness direction of the lower stage 332.

Figure 19:
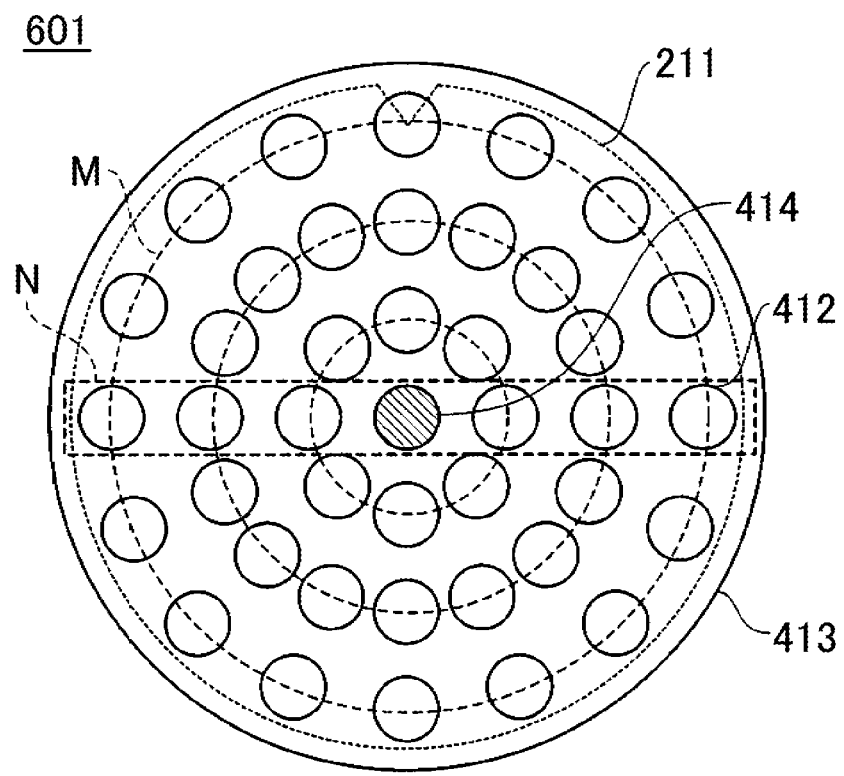
FIG. 19 is a schematic cross-sectional view of the correcting section 601.

FIG. 19 is a schematic planar view of the correcting section 601, and shows the layout of actuators 412 in the correcting section 601. In the correcting section 601, the actuators 412 are arranged radially with the support column 414 at the center. Furthermore, the arrangement of the actuators 412 can be thought of as being concentric circles with the support column 414 as the center. The arrangement of the actuators 412 is not limited to the arrangement shown in FIG. 19, and may be a lattice arrangement, for example.

Figure 20:
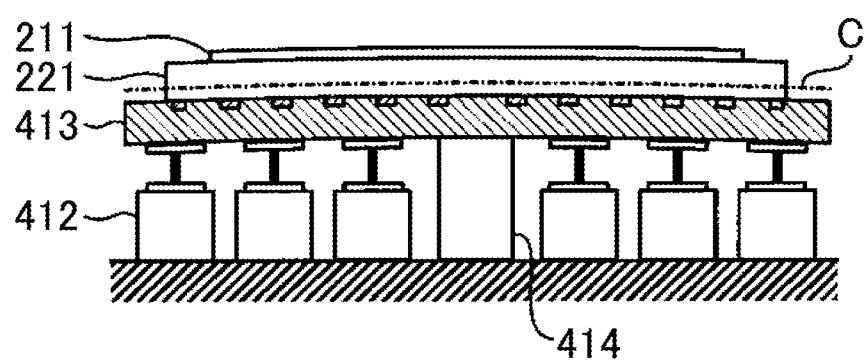
FIG. 20 is a schematic view for describing operation of the correcting section 601.

FIG. 20 is a drawing for describing the operation of the correcting section 601. As shown in the drawing, by individually opening and closing the valves 416 in a state where the substrate holder 221 holding the substrate 211 is attracted to the attracting section 413, it is possible to deform the substrate 211 on the lower stage 332 of the aligner 300.

As shown in FIG. 19, the actuators 412 can be regarded as being arranged in concentric circles, i.e. in the circumferential direction of the lower stage 332. Accordingly, as shown by the dotted line M in FIG. 19, by grouping the actuators 412 in each circle and increasing the extension amount when closer to the center, it is possible to cause a protrusion in the center of the surface of the attracting section 413 and cause a deformation that is spherical, parabolic, or the like, as shown in FIG. 20. In this way, the substrate holder 221 and the substrate 211 held by the attracting section 413 are also deformed to have surfaces that are spherical, parabolic, or the like.

Figure 21:
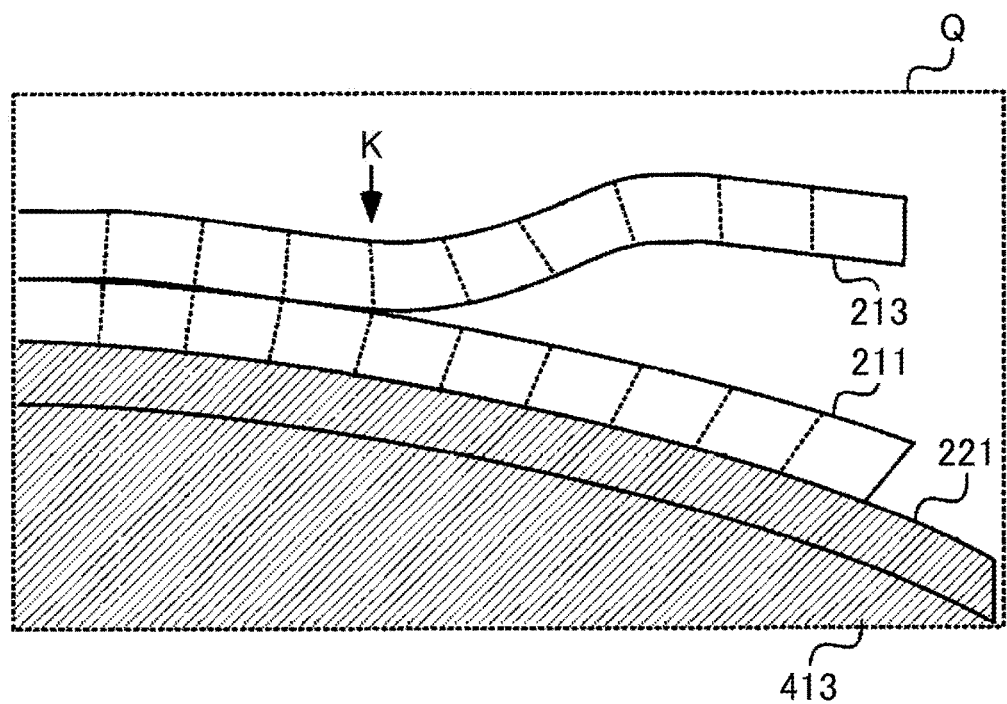
FIG. 21 is a schematic view for describing correction of the substrate 211 by the correcting section 601.

FIG. 21 is a schematic view for describing the correction performed by the correcting section 601. FIG. 21 shows a portion of the substrates 211 and 213 in the stacking process, in the same manner as in FIG. 9.

In the stacking process, as described with reference to FIGS. 10 to 12, the substrate 213 being stacked on the substrate 211 experiences stretching deformation on the bottom surface in the drawing being bonded to the substrate 211, at the boundary K between the region already bonded to the substrate 211 and the region that is to be bonded but is still distanced from the substrate 211. In contrast, in the state where the correcting section 601 has operated, the center of the substrate 211 protrudes more than the edges, and the overall surface of the substrate 211 forms a spherical or parabolic surface. Therefore, the top surface of the substrate 211 in the drawing bonded to the substrate 213 widens compared to the flat state, as shown by the dotted lines in the drawing.

In this way, by operating the correcting section 601, the bonding surfaces of both the substrate 211 and the substrate 213 deform by stretching, and therefore the misalignment of the circuit regions 216 between the substrates 211 and 213 is corrected. Each actuator 412 can be controlled individually by the correcting section 601. Accordingly, even if the substrate 211 to be corrected has an uneven stretching amount distribution, it is possible to perform correction with different correction amounts in each region of the substrate 211. The drive amounts, e.g. the displacement amounts, of the plurality of actuators 412 are set according to the misalignment amount between the substrates 211 and 213 caused by the difference of the amounts of deformation in the surface of at least one of the substrates 211 and 213. At this time, as described above, the result of a misalignment amount occurring from experimental bonding using substrates having an equivalent usage as the two substrates 211 and 213 being bonded may be used.

For example, in the same manner as the silicon single-crystal substrate 208 shown in FIG. 16, when the shift amount is greater in the 0° and 90° directions due to the bending rigidity in the 45° direction being low in the substrate 213, the actuators 412 are controlled such that the height position of the portion of the substrate holder 221 corresponding to the region of the substrate 213 in the 45° direction is relatively higher than the height position of the portion corresponding to the regions in the 0° and 90° directions. In this way, it is possible to make the air layer between the region of the substrate 213 in the 45° direction and the corresponding region of the substrate 211 thinner and to make the resistance received from this air layer lower, and therefore it is possible to reduce the difference in the amount of deformation in the surface caused by the unevenness of the rigidity distribution of the silicon single-crystal substrate 208.

Alternatively, when the shift amount is greater in the 0° and 90° directions due to the bending rigidity in the 45° direction being low in the substrate 213, by making the height position of the portion of the substrate holder 221 corresponding to the region of the substrate 213 in the 45° direction relatively lower than the height position of the portion corresponding to the regions in the 0° and 90° directions, the region of the substrate 211 in the 45° direction is stretched. This height difference is set according to the amount of deformation of the region of the substrate 213 in the 45° direction.

Figure 22:
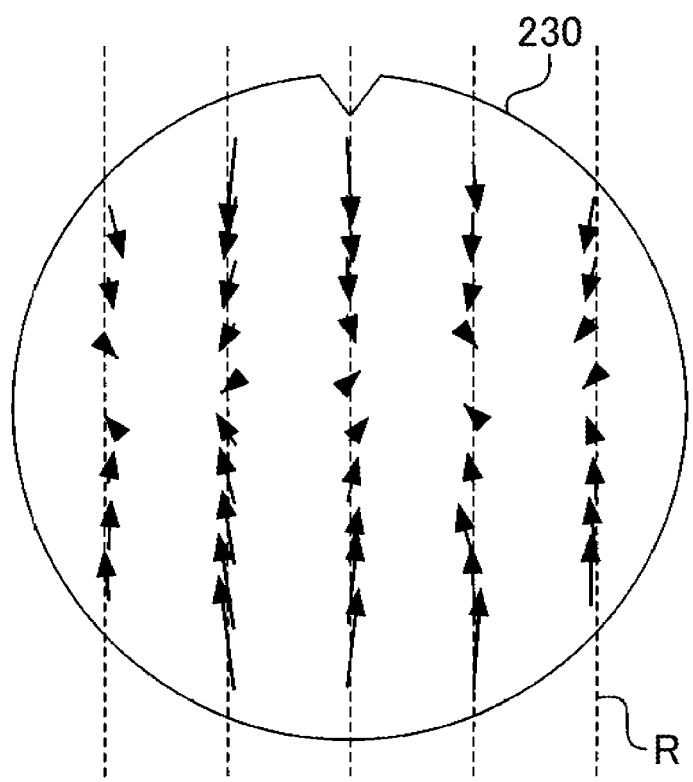
FIG. 22 is a schematic view for describing correction using the correcting section 601.

FIG. 22 shows another distribution of the misalignment of the circuit regions 216 occurring in the layered structure substrate 230 due to the uneven distribution of the stretching amount. The misalignment caused by the differences in the crystal orientations of the substrates, the physical properties of the scribe lines, or the like has a parallel distribution in the layered structure substrate 230, as shown by the dotted line R in the drawing.

Figure 23:
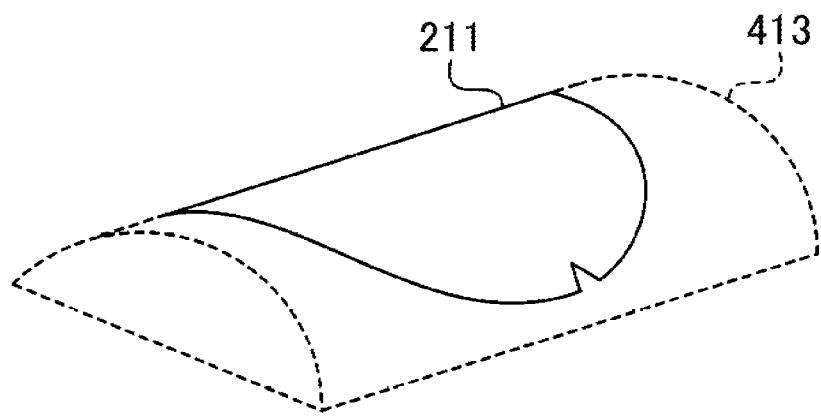
FIG. 23 is a schematic view for describing operation of the correcting section 601.

FIG. 23 shows a method by which the correcting section 601 performs the correction when anisotropy occurs in the misalignment amount distribution. As shown in the drawing, when correcting the misalignment that has a distribution in a specified direction, as shown by the dotted line N in FIG. 19, the actuators 412 lined up in a column are extended to deform the attracting section 413 of the correcting section 601 into a cylindrical shape. For example, when this misalignment is caused by the crystal orientation of the substrate and the crystal direction is along the dotted line R of FIG. 22, the substrate 211 is curved on a line orthogonal to the dotted line R. In this way, the progression direction of the bonding wave of the substrate stacked on the substrate 211 is along the crystal direction. Therefore, the stretching deformation occurs in the substrate 211 only in the circumferential direction of the cylindrical surface formed by the attracting section 413. In this way, it is possible to correct the misalignment of the substrate 211 in the specified direction.

When using the correcting section 601, it is possible to continuously change the correction amount according to the amount of operational fluid supplied to the actuators 412. However, when stacking a large number of substrates 211 having equivalent correction methods and correction amounts, it is possible to stack the substrate 211 while correcting the misalignment amount with a simple aligner 300 that does not include the correcting section 601, by preparing the substrate holder 221 that holds the substrate 211 with a holding surface that has a shape reflecting the correction amount. Furthermore, the uneven stretching amount may be corrected by providing the substrate holder 221 with a characteristic that decreases the unevenness of the stretching amount of the substrate 211 and holding the substrate 211 with the substrate holder 221.

For example, by holding the substrate 211 with the substrate holder 221 having low rigidity at the portion corresponding to the position of the substrate 211 that has high bending rigidity and having high rigidity at the portion corresponding to the portion of the substrate 211 that has low bending rigidity, it is possible to make the difference of the bending rigidity in the surface of the substrate 211 be within a prescribed range. This prescribed range is a range in which it is possible for the circuits in at least the region of the substrate 211 having low rigidity and the circuits of the substrate on which the substrate 211 is stacked to be able to be bonded to each other, in a state where the deformation occurs in the substrate 211 during the bonding wave.

Furthermore, in the example described above, a case is described in which the correcting section 601 is provided to the lower stage 332. However, the correcting section 601 may be provided to the upper stage 322 and the substrate 213 on the top side in the drawing may be corrected. Furthermore, the correcting section 601 may be provided to both the lower stage 332 and the upper stage 322, and the correction may be performed on both of the substrates 211 and 213. Yet further, another correction method that has already been described or another correction method that will be described further below may be combined with the correction method described above.

Furthermore, instead of or in addition to the substrate holder 221, the holding surface of the stage or the like that holds the substrate 211 may be a curved surface reflecting the target correction amount. Yet further, even when the substrate 211 is stacked without using the substrate holder 221, it is possible to restrict the unevenness if the stretching state of the substrate 213 by making the holding surface on the holding section of the stage or the like holding the substrate 211 a curved surface reflecting the target correction amount.

Instead of or in addition to any one of the methods described above, the shift caused by the unevenness of the amount of deformation when bonding may be corrected by adjusting the temperature of the substrate 211. In this case, when the amount of deformation of the portion of the substrate in the 45° direction is larger than in other portions, for example, this portion is made to extend by being heated, or portions other than the portion in the 45° direction are made to contract by being cooled.

Figure 24:
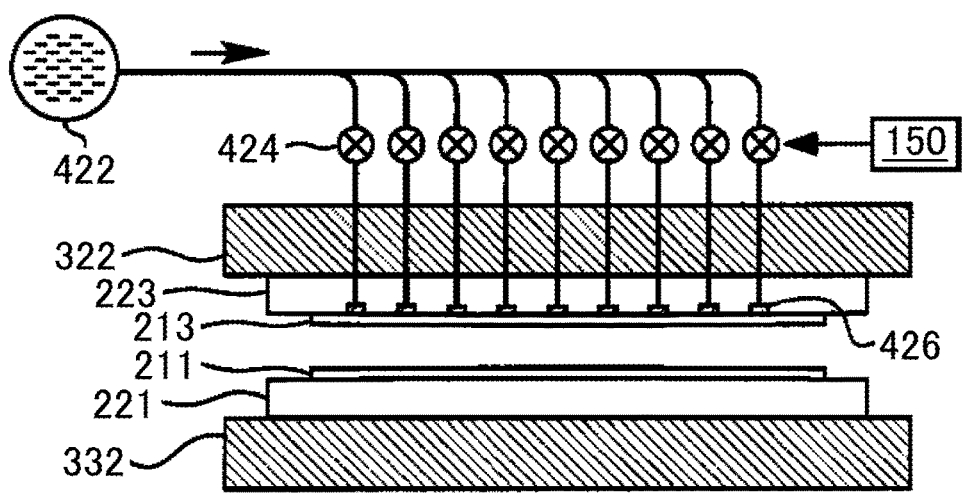
FIG. 24 is a schematic cross-sectional view of the correcting section 602.

FIG. 24 is a schematic cross-sectional view of another correcting section 602, and shows one example of controlling the progression of the contact, with the substrate 213, of a region of the one substrate 211 corresponding to the progression direction in which the amount of deformation is greater than in other progression directions. The correcting section 602 is incorporated in the substrate holder 223 that is used by the upper stage 322 of the aligner 300.

The correcting section 602 is provided to the substrate holder 223 and includes a plurality of opening portions 426 that open toward the substrate 213 held by the substrate holder 223. One end of each opening portion 426 passes through the upper stage 322 to communicate with the pressure source via a valve 424. The pressure source 422 is a pressurized fluid such as compressed dried air, for example. The valves 424 are individually opened and closed under the control of the control section 150. When a valve 424 is open, the pressurized fluid is ejected from the corresponding opening portion 426.

Figure 25:
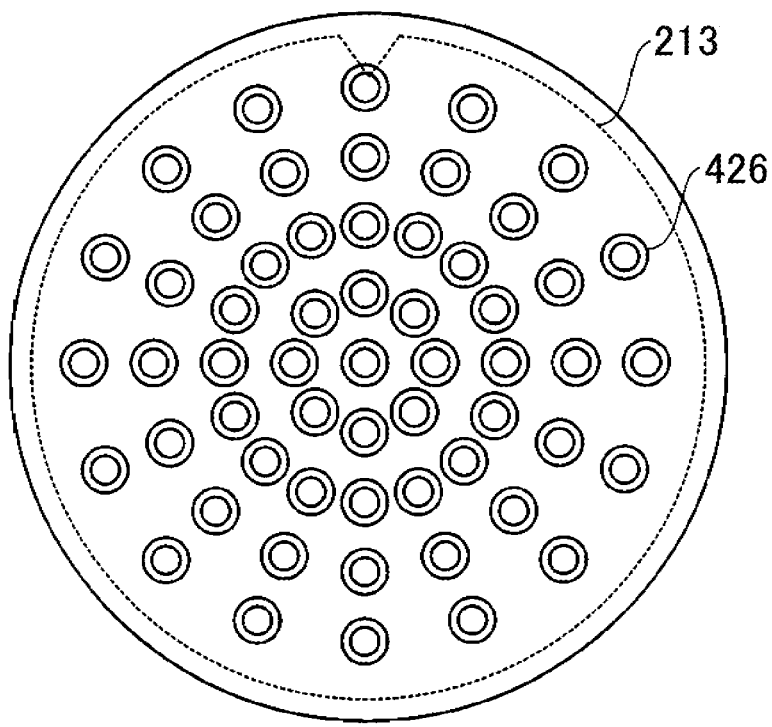
FIG. 25 is a schematic cross-sectional view of the correcting section 602.

FIG. 25 shows a layout of the opening portions 426 in the correcting section 602. The opening portions 426 are arranged across the entire holding surface of the substrate holder 223 holding the substrate 213. Accordingly, by opening any one of the valves 424, it is possible to eject the pressurized fluid toward the bottom in the drawing at an arbitrary position in the holding surface of the substrate holder 223.

The substrate holder 223 holds the substrate 213 using a electrostatic chuck, for example. The electrostatic chuck can eliminate the attractive force by cutting off the power supply, but a time lag occurs until the substrate 213 held by the residual charge or the like is released. Therefore, it is possible to immediately release the substrate 213 by ejecting the pressurized fluid from the opening portions 426 across the entire substrate holder 223 immediately after the supply of power to the electrostatic chuck is cut off.

Figure 26:
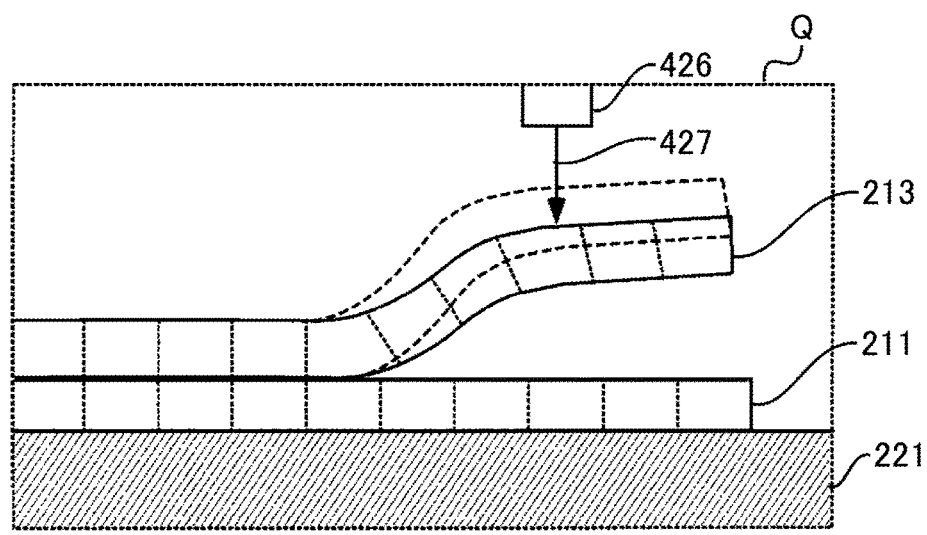
FIG. 26 is a schematic view for describing operation of the correcting section 601.

FIG. 26 is a schematic view for describing the correction operation of the correcting section 602. FIG. 26 shows a portion of the substrates 211 and 213 in the stacking process, in the same manner as in FIG. 9.

In the stacking process, as described with reference to FIGS. 10 to 12, the substrate 213 being stacked on the substrate 211 experiences stretching deformation on the bottom surface in the drawing being bonded to the substrate 211, at the boundary K between the region already bonded to the substrate 211 and the region that is to be bonded but is still distanced from the substrate 211. Here, when the pressurized fluid 427 is ejected from the top in the drawing by the correcting section 602 at the region near the boundary K where deformation occurs in the substrate 213, the substrate 213 is pressed toward the other substrate 211 and the amount of deformation is reduced. In this way, the stretching amount of the substrate 213 can be corrected to be smaller at the location at which the pressurized fluid is blown.

In this way, since it is possible to restrict the stretching deformation in the substrate 213 due to the operation of the correcting section 602, it is possible to correct the misalignment of the circuit regions 216 caused by the uneven stretching amount between the substrates 211 and 213. In the correcting section 602, the opening portions 426 can eject the pressurized fluid individually. Accordingly, even when the stretching amount distribution of the substrate 213 to be corrected is uneven, it is possible to perform the correction using different correction amounts for each region of the substrate 213.

Accordingly, in the aligner 300 including the correcting section 602, the unevenness of the rigidity is investigated in advance based on the crystal orientation of the substrate 213, the arrangement of the structures, the thickness distribution, and the like, and it is possible to correct the stretching amount of the substrate 213 by, for example, blowing the pressurized fluid from the opening portions 426 onto the region of the substrate 213 having larger shift amounts from among the region having low bending rigidity and the region having high bending rigidity. In this way, it is possible to restrict the misalignment of the circuit regions 216 in the layered structure substrate 230 manufactured by stacking the substrates 211 and 213.

For example, if the region of the substrate 213 with high bending rigidity has a large misalignment amount, when the protrusion amount or curvature of the correcting section 602 shown in FIG. 21 is determined using a low-rigidity region, in which the shift amount is to be corrected for a region of the substrate 213 with low rigidity, as a reference, it is possible to reduce the shift amount in the high-rigidity region by blowing the pressurized fluid onto the high-rigidity region.

In the example described above, a case is described in which the correcting section 602 is provided to the upper stage 322. However, in the aligner 300 having a structure in which the substrate 211 held by the lower stage 332 deforms, the correcting section 602 may be provided to the lower stage 332 and the substrate 211 on the bottom side in the drawing may be corrected. Furthermore, the correcting section 602 may be provided to both the lower stage 332 and the upper stage 322, and the correction may be performed on both of the substrates 211 and 213.

Yet further, another correction method that has already been described or another correction method that will be described further below may be combined with the correction method described above. In addition, the correcting section 602 can be incorporated in the aligner 300 and used together with the correcting section 601 shown in FIG. 18.

Figure 27:
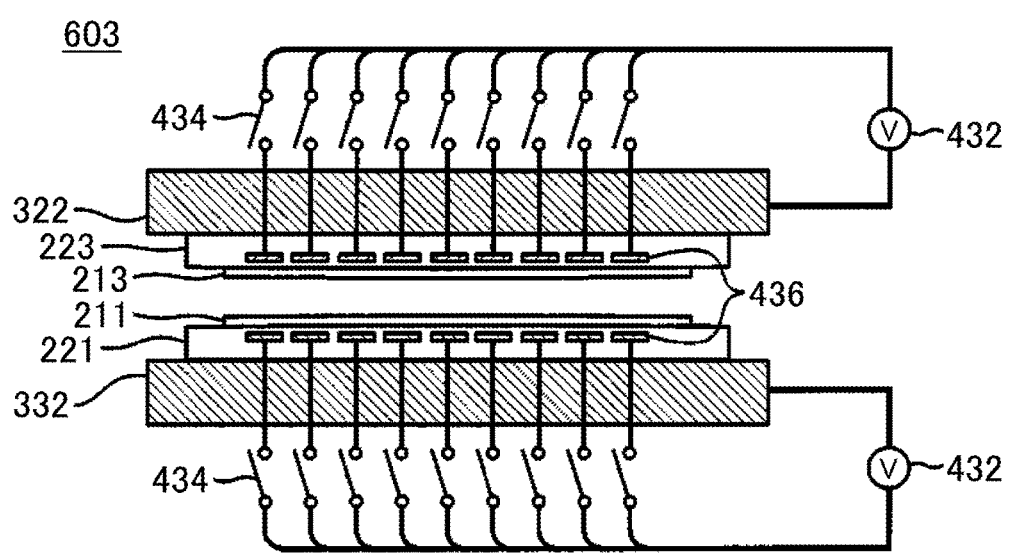
FIG. 27 is a schematic cross-sectional view of the correcting section 603.

FIG. 27 is a schematic cross-sectional view of another correcting section 603. The correcting section 603 is incorporated in the substrate holders 221 and 223 used by the aligner 300.

The correcting section 603 includes switches 434, electrostatic chucks 436, and a voltage source 432. The electrostatic chucks 436 are embedded in the substrate holders 221 and 223. Each electrostatic chuck 436 is coupled to the common voltage source 432 via an independent switch 434. In this way, when the switches 434 are opened and closed under the control of the control section 150, each electrostatic chuck 436 attracts the substrate 211 or 213 thereto by generating an attractive force on the surface of the substrate holder 221 or 223.

The electrostatic chucks 436 in the correcting section 603 are arranged across the entire holding surface of each of the substrate holders 221 and 223 holding the substrates 211 and 213, in the same manner as the opening portions 426 of the correcting section 602 shown in FIG. 25. In this way, the substrate holders 221 and 223 each include a plurality of attractive regions. Accordingly, when any one of the switches 434 is closed, the corresponding electrostatic chuck 436 generates an attractive force and the attractive force acts on the substrates substrate 211 and 213 at an arbitrary position on the holding surface of the substrate holder 223. When all of the switches 434 are closed, all of the electrostatic chucks 436 generate an attractive force, and the substrates 211 and 213 are held firmly by the substrate holders 221 and 223.

Figure 28:
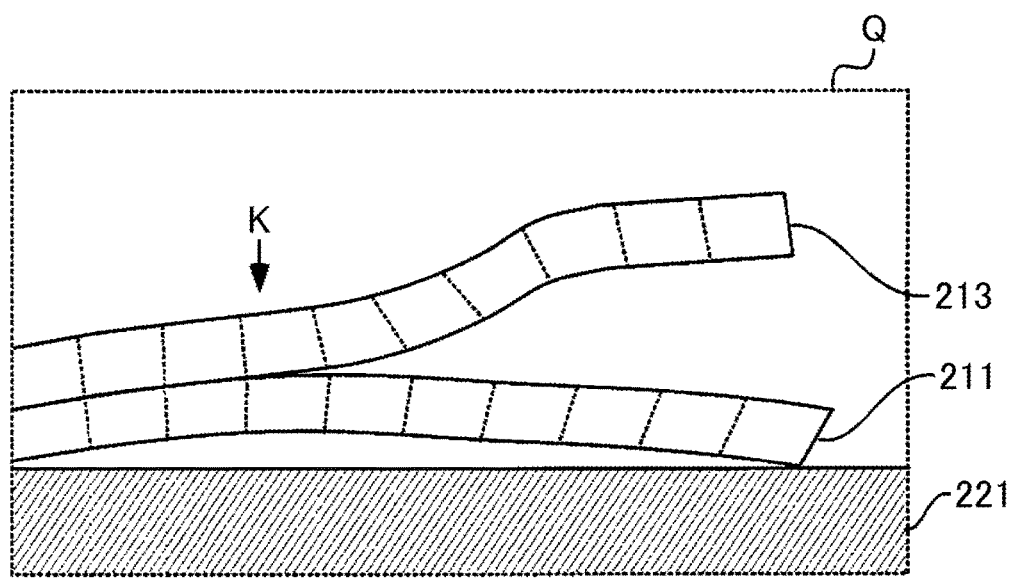
FIG. 28 is a schematic view for describing operation of the correcting section 601.

FIG. 28 is a diagram for describing the correction operation of the correcting section 603. FIG. 28 shows a portion of the substrates 211 and 213 in the stacking process, in the same manner as in FIG. 9.

In the stacking process, as described with reference to FIGS. 10 to 12, the substrate 213 being stacked on the substrate 211 experiences stretching deformation on the bottom surface in the drawing being bonded to the substrate 211, at the boundary K between the region already bonded to the substrate 211 and the region that is to be bonded but is still distanced from the substrate 211. Here, when the attractive force acts on the substrate 213 from above due to the correcting section 603 at the region near the boundary K where the deformation occurs in the substrate 213, deformation occurs in the substrate 213 that is larger than the deformation occurring when correction is not performed, as shown by the dotted line in the drawing. In this way, it is possible to increase the stretching amount of the substrate 213 at the location where am electrostatic chuck 436 operates.

This correction is performed on portions where the shift amount, i.e. the amount of deformation, caused by the rigidity distribution of the substrate is large. For example, in the silicon single-crystal substrate 208 shown in FIG. 16, when the shift amount is greater in the 0° and 90° directions due to the bending rigidity in the 45° direction being low, the attractive force of the electrostatic chucks 436 corresponding to the 45° direction among the plurality of electrostatic chucks 436 of the substrate holder 223 is made larger than the attractive force of the electrostatic chucks 436 corresponding to the 0° and 90° directions.

Furthermore, in the process of stacking the pair of substrates 211 and 213 on each other by releasing the attraction of the substrate 213 to the substrate holder 223, when the holding of the substrate 211 by the substrate holder 221 on the lower stage 332 is partially released, in this region, the substrate 211 on the bottom side floats up from the substrate holder 221 to follow the substrate 213 on the top side. In this way, the deformation in the substrate 211 on the bottom side is ameliorated, and it is possible to further decrease the stretching amount.

This correction is performed on portions where the shift amount, i.e. the amount of deformation, caused by the rigidity distribution of the substrate is large. For example, in the silicon single-crystal substrate 208 shown in FIG. 16, when the shift amount is greater in the 0° and 90° directions due to the bending rigidity in the 45° direction being low, the electrostatic chucks 436 corresponding to the 45° direction among the plurality of electrostatic chucks 436 of the substrate holder 221 sequentially release the substrate in accordance with the degree of progression of the contact between the pair of substrates 211 and 213. In this way, by controlling the setting and change of the holding force on the substrate 211 held by the lower stage 332 according to the rigidity distribution of the substrate 211, it is possible to reduce the difference in the amount of deformation caused by the rigidity distribution in the substrate.

In this way, it is possible to encourage or restrict the stretching deformation in the substrates 211 and 213 as a result of the operation of the correcting section 603. Furthermore, the electrostatic chucks 436 arranged across the entirety of each of the substrate holders 221 and 223 can individually generate or cut off the attractive force. Accordingly, even when the stretching amount in the substrates 211 and 213 has an uneven and complex distribution, it is possible to perform correction with the correcting section 603.

In the example described above, the substrates 211 and 213 are stacked as a result of the autonomous bonding of the substrate 213 on the substrate 211 held by the lower stage 332, which is realized by releasing the hold on the substrate 213 by the upper stage 322 all at once. However, the autonomous bonding of the substrate 213 may be restricted and the expansion of the region where the substrates 211 and 213 contact each other, i.e. the degree of progression of the contact, may be controlled by sequentially eliminating the attractive force of the electrostatic chucks 436 from the center of the substrate toward the outside in the surface direction of the upper stage 322. In this way, it is possible to restrict the misalignment distribution from becoming uneven due to the accumulation of misalignment closer to the edge portions.

In this way, by controlling the setting and change of the holding force on the substrate 211 held by the upper stage 322 according to the rigidity distribution of the substrate 211, it is possible to reduce the difference in the amount of deformation caused by the rigidity distribution in the substrate. Furthermore, the above describes an example in which the substrates are held by electrostatic chucks, but instead of or in addition to this, the substrates may be held by vacuum chucks.

In this case, the density of pins provided on the holding surface holding the substrate may be set according to the rigidity distribution of the substrate. For example, in the silicon single-crystal substrate 208 shown in FIG. 16, when the shift amount is greater in the 0° and 90° directions due to the bending rigidity in the 45° direction being low, by making the density of the pins arranged at positions corresponding to the 45° direction less than the density of the pins arranged at positions corresponding to the 0° and 90° directions, it is possible to reduce the attractive force acting on the region in the 45° direction.

In the method described above, instead of or in addition to adjusting the pin density, the attractive force used when holding the substrate 211 may be adjusted. For example, the holding surface holding the substrate 211 may be divided into a plurality of regions and the attractive force may be changed for each region according to the amount of deformation of the substrate. In this way, if the direction of the notch 214 is 0°, for example, when the amount of deformation of the portion in the 45° direction is large, the attractive force of the four regions corresponding to this portion is made smaller than the attractive force of other regions. In this way, it is possible to correct regions where the amount of deformation is large in different portions.

Furthermore, even when stacking the substrates 211 and 213 by continuing to hold the substrate 213 with the upper stage 322 and releasing the hold on the substrate 211 by the lower stage 332, it is possible to correct the stretching amount of the substrates 211 and 213 using the correcting section 603 in the same manner as described above.

When one substrate among the substrates being stacked on each other is a substrate that experiences significant initial distortion or significant warping deformation during circuit formation, oxide film formation, or the like or a silicon single-crystal substrate 209 having complex crystal orientation such as shown in FIG. 17, for example, this substrate is preferably secured to the lower stage 332. In this way, it is possible to simplify the shift correction control.

Another correction method that has already been described or another correction method that will be described further below may be combined with the correction method described above. In addition, the correcting section 603 can be incorporated in the aligner 300 and used together with the correcting section 601 shown in FIG. 18 and the correcting section 602 shown in FIG. 24.

In this way, it is possible to restrict or prevent misalignment of the circuit regions 216 caused by the uneven stretching amount in the substrates 211 and 213, by individually correcting the substrate 211 and the 213 or by performing correction in the step of stacking the substrates 211 and 213. In this way, the layered structure substrates 230 can be manufactured with good yield.

In the example described above, the centers of the substrates 211 and 213 being stacked contact each other first, but as long as simultaneous contact at a plurality of locations is avoided, the substrates 211 and 213 may contact each other at other locations, such as the edge portions. In this case, in the same manner as in the example described above, the one substrate among the substrates 211 and 213 being stacked on each other is deformed in advance according to the different amount of deformation caused by the deformation distribution of the other substrate that is being released from being held, i.e. the direction in which the contact region between the substrates 211 and 213 expands, which is the progression direction of the bonding wave, and the progression of the bonding wave of the other substrate is controlled. At this time, crystal direction and the stress distortion direction of the substrate released from the hold of the stage or the substrate holder are preferably along the progression direction of the bonding wave. For example, in the silicon single-crystal substrate 208 shown in FIG. 16, by causing the 0° direction to be along the progression direction of the bonding wave, the stretching amount of the silicon single-crystal substrate 208 occurring during the bonding wave becomes uniform. In this way, it is possible to reduce the difference of the amount of deformation in the silicon single-crystal substrate 208 caused by the rigidity distribution.

The shape of the boundary K that expands in accordance with the stacking from an initial contact location may be another shape, such as a line or an ellipse. Furthermore, the above example is described such that the correction appears to be performed on known substrates 211 and 213, but in the process of designing and manufacturing the substrates 211 and 213, the mechanical specifications such as the bending rigidity may be considered in a manner to prevent unevenness.

In the example described above, the silicon single-crystal substrate is provided as an example, and the substrate is formed from single-crystal silicon in the present embodiment, but it is obvious that the substrates being stacked are not limited to being silicon single-crystal substrates. Examples of other substrates include an SiGe substrate doped with Ge and a Ge single-crystal substrate. Furthermore, the present invention can be adopted for compound semiconductor substrates such as group III-V or group II-VI substrates.

In the present embodiment, the term "bonding" refers to a state in which the terminals provided to two substrates layered according to a method described in the present embodiment are connected to each other to ensure electrical conduction between the two substrates 210 or a state in which the degree of bonding between the two substrates is greater than or equal to a prescribed strength, or to a state in which, as a result of performing an annealing process or the like on the substrates after the substrates have been layered according to a method described in the present embodiment, the two substrates are ultimately electrically connected to each other or the degree of bonding between the two substrates is greater than or equal to a prescribed strength and the two substrates are temporarily bonded, i.e. tentative bonding. The state of tentative bonding includes a state in which the two stacked substrates can be separated from each other and reused.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

LIST OF REFERENCE NUMERALS

100: substrate stacking apparatus, 110: case, 120, 130: substrate cassette, 140: transfer robot, 150: control section, 208, 209: silicon single-crystal substrate, 210, 211, 213, 501, 502: substrate, 212: scribe line, 214: notch, 216: circuit region, 218: alignment mark, 220, 221, 222, 223: substrate holder, 426: opening portion, 230: layered structure substrate, 300: aligner, 301: floor surface, 310: frame, 312: bottom plate, 314: support column, 316: top plate, 322: upper stage, 324: microscope, 326, 336: activation apparatus, 331: X-direction drive section, 332: lower stage, 333: Y-direction drive section, 338: raising and lowering drive section, 400: holder stocker, 411: base portion, 412: actuator, 413: attracting section, 414: support column, 415: pump, 416, 424: valve, 422: pressure source, 427: pressurized fluid, 432: voltage source, 434: switch, 436: electrostatic chuck, 500: pre-aligner, 601, 602, 603: correcting section

What is claimed is:

1. A substrate stacking apparatus that stacks a first substrate and a second substrate on each other, to make a substrate stack, which is separable from the substrate stacking apparatus, by forming a contact region where the first substrate held by a first holding section and the second substrate held by a second holding section contact each other, at one portion of the first substrate and the second substrate, and then expanding the contact region from the one portion by releasing holding of the first substrate by the first holding section, wherein
an amount of deformation occurring in at least the first substrate differs at positions having the same distance from a center of the at least the first substrate in a plurality of circumferential directions,
the substrate stacking apparatus comprises a restricting section that restricts misalignment between corresponding circuit connection terminals of the first substrate and the second substrate caused by a difference in the amount of deformation, and
the substrate stack retains the restricted misalignment when separated from the substrate stacking apparatus.

2. The substrate stacking apparatus according to claim 1, wherein the restricting section restricts the misalignment such that an amount of the misalignment is less than or equal to a prescribed value.

3. The substrate stacking apparatus according to claim 1, wherein the restricting section deforms the second substrate according to a direction of the first substrate in which the misalignment occurs.

4. The substrate stacking apparatus according to claim 3, wherein the restricting section is provided to the second holding section and includes an adjusting section that adjusts height positions of a plurality of portions of a holding surface holding the second substrate.

5. The substrate stacking apparatus according to claim 4, wherein the adjusting section includes a plurality of actuators that are arranged along the holding surface and perform displacement in a thickness direction of the second substrate, and the plurality of actuators are driven by a displacement amount linked to an amount of the misalignment.

6. The substrate stacking apparatus according to claim 3, wherein the restricting section is provided to at least the second holding section and includes a holding surface that holds the second substrate and has a plurality of portions each having a height position linked to an amount of the misalignment.

7. The substrate stacking apparatus according to claim 6, wherein at least the second holding section is a substrate holder that is transported in a state of holding the second substrate, and the holding surface is a surface of the substrate holder holding the second substrate.

8. The substrate stacking apparatus according to claim 1, wherein the restricting section controls progression of contact, with the second substrate, of a region of the first substrate corresponding to one direction among the plurality of circumferential directions in which the amount of deformation is larger than in other directions.

9. The substrate stacking apparatus according to claim 8, wherein at least the first holding section includes a plurality of attractive regions that attract the first substrate, and the restricting section, when the first substrate and the second substrate are being stacked, sequentially releases the first substrate from being attracted to the plurality of attractive regions from the one portion, according to a degree of progression of the contact between the first substrate and the second substrate.

10. The substrate stacking apparatus according to claim 8, wherein the restricting section includes a pressing section that, after the first substrate and the second substrate have contacted each other at the one portion, presses at least one of the first substrate and the second substrate toward the other substrate with a pressing force linked to an amount of the misalignment, in a region where the first substrate and the second substrate do not contact each other.

11. The substrate stacking apparatus according to claim 10, wherein the pressing section includes an ejecting section that ejects a fluid toward a portion of at least one of the first substrate and the second substrate.

12. The substrate stacking apparatus according to claim 1, wherein the restricting section includes an atmospheric pressure adjusting section that adjusts pressure around the first substrate and the second substrate according to a distribution of the amount of deformation of the first substrate.

13. The substrate stacking apparatus according to claim 1, wherein the restricting section restricts the misalignment using the amount of deformation in one direction in which the amount of deformation of the first substrate is smallest among the plurality of circumferential directions as a reference.

14. A substrate processing method for stacking a first substrate and a second substrate on each other, to make a substrate stack, which is separable from a substrate stacking apparatus, by forming a contact region, where the first substrate held by a first holding section of the substrate stacking apparatus and the second substrate held by a second holding section of the substrate stacking apparatus contact each other, at one portion of the first substrate and the second substrate, and then expanding the contact region from the one portion by releasing holding of the first substrate by the first holding section, wherein
    an amount of deformation occurring in at least the first substrate differs at positions having the same distance from a center of the at least the first substrate in a plurality of circumferential directions,
    the substrate processing method comprises a restricting step of restricting misalignment between corresponding circuit connection terminals of the first substrate and the second substrate caused by a difference in the amount of deformation, and
    the substrate stack retains the restricted misalignment when separated from the substrate stacking apparatus.

15. The substrate processing method according to claim 14, wherein the restricting step includes restricting the misalignment such that an amount of the misalignment is less than or equal to a prescribed value.

16. The substrate processing method according to claim 14, wherein the restricting step includes deforming the second substrate according to a direction of the first substrate in which the misalignment occurs.

17. The substrate processing method according to claim 14, wherein the restricting step includes forming a circuit, on at least the second substrate, at a position corresponding to a position of a circuit of the first substrate after deformation.

18. The substrate processing method according to claim 17, wherein the restricting step includes repeatedly exposing the circuit at intervals corresponding to the amount of deformation of the first substrate.

19. The substrate processing method according to claim 14, wherein the restricting step includes forming a structure, by which a modulus of elasticity of the first substrate is partially changed, in at least the first substrate.

20. The substrate processing method according to claim 19, wherein the structure is formed on a scribe line of the first substrate.

21. The substrate processing method according to claim 14, wherein the restricting step includes: selecting the first substrate and the second substrate such that the difference in the amount of deformation in the plurality of circumferential directions corresponding to each other is less than or equal to a prescribed value, and when stacking the first substrate and the second substrate, releasing holding of the first substrate to the first holding section and releasing holding of the second substrate to the second holding section.

22. The substrate processing method according to claim 14, comprising: an activating step of activating a contact surface of each of the first substrate and the second substrate, wherein the restricting step includes, in the activating step, adjusting a degree of activation of at least one of the first substrate and the second substrate, according to the amount of deformation of the first substrate.

23. The substrate processing method according to claim 14, comprising: setting the first substrate to be whichever substrate, among two substrates to be stacked on each other, has at least one of a distortion amount and a warping amount that is relatively smaller in a state where the two substrate are not held by holding sections, that are for respectively holding the two substrates.

24. The substrate processing method according to claim 14, comprising: setting the first substrate to be whichever substrate, among two substrates to be stacked on each other, has a smaller difference in the amount of deformation.

* * * * *